(12) United States Patent
Hasan et al.

(10) Patent No.: US 11,881,374 B2
(45) Date of Patent: Jan. 23, 2024

(54) APPARATUS FOR AND METHOD OF CONTROLLING AN ENERGY SPREAD OF A CHARGED-PARTICLE BEAM

(71) Applicant: ASML Netherlands B.V., Veldhoven (NL)

(72) Inventors: Shakeeb Bin Hasan, Eindhoven (NL); Yan Ren, Eindhoven (NL); Maikel Robert Goosen, Eindhoven (NL); Albertus Victor Gerardus Mangnus, Eindhoven (NL); Erwin Paul Smakman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 231 days.

(21) Appl. No.: 17/430,307

(22) PCT Filed: Feb. 4, 2020

(86) PCT No.: PCT/EP2020/052662
§ 371 (c)(1),
(2) Date: Aug. 11, 2021

(87) PCT Pub. No.: WO2020/164951
PCT Pub. Date: Aug. 20, 2020

(65) Prior Publication Data
US 2022/0148842 A1 May 12, 2022

(30) Foreign Application Priority Data

| Feb. 13, 2019 | (EP) | 19157009 |
| Jan. 6, 2020 | (EP) | 20150384 |
| Jan. 23, 2020 | (EP) | 20153263 |

(51) Int. Cl.
*H01J 37/04* (2006.01)
*H01J 37/28* (2006.01)

(52) U.S. Cl.
CPC .............. *H01J 37/04* (2013.01); *H01J 37/28* (2013.01); *H01J 2237/028* (2013.01)

(58) Field of Classification Search
CPC ...... H01J 37/04; H01J 37/28; H01J 2237/028; H01J 2237/0475; H01J 2237/057;
(Continued)

(56) References Cited

U.S. PATENT DOCUMENTS

| 2007/0181805 A1 | 8/2007 | Mori et al. | |
| 2013/0240251 A1* | 9/2013 | Kaplan | H01Q 7/00 |
| | | | 216/13 |
| 2016/0227639 A1 | 8/2016 | Kaminer et al. | |

FOREIGN PATENT DOCUMENTS

| JP | 2013533754 A | 8/2013 |
| TW | 201643929 A | 12/2016 |

OTHER PUBLICATIONS

Guo C, Zhang J, Xu W, Liu K, Yuan X, Qin S, Zhu Z. Graphene-Based Perfect Absorption Structures in the Visible to Terahertz Band and Their Optoelectronics Applications. Nanomaterials (Basel). Dec. 12, 2018;8(12):1033. doi: 10.3390/nano8121033. PMID: 30545038; PMCID: PMC6316068. (Year: 2018).*

(Continued)

*Primary Examiner* — Rebecca C Bryant
*Assistant Examiner* — Christopher J Gassen
(74) *Attorney, Agent, or Firm* — FINNEGAN, HENDERSON, FARABOW, GARRETT & DUNNER, LLP

(57) ABSTRACT

Disclosed among other aspects is a charged particle inspection system including an absorbing component and a programmable charged-particle mirror plate arranged to modify the energy distribution of electrons in a beam and shape the beam to reduce the energy spread of the electrons and aberrations of the beam, with the absorbing component including a set of absorbing structures configured as absorb- (Continued)

ing structures provided on a transparent conductive layer and a method using such an absorbing component and with the programmable charged-particle mirror plate including a set of pixels configured to generate a customized electric field to shape the beam and using such a programmable charged-particle mirror plate.

15 Claims, 18 Drawing Sheets

(58) Field of Classification Search
CPC ......... H01J 2237/151; H01J 2237/1534; H01J 2237/2817; H01J 37/05; H01J 37/26
See application file for complete search history.

(56) References Cited

OTHER PUBLICATIONS

R. Alaee et al., *Deep-Subwavelength Plasmonic Nanoresonators Exploiting Extreme Coupling*, Nano Lett. 13, 3482 (2013).
R. Alaee et al., *A perfect absorber made of a graphene micro-ribbon metamaterial*, Opt. Express 20, 28017 (2012).
R. Alaee et al., *Perfect absorbers on curved surfaces and their potential applications*, Opt. Express 20, 18370 (2012).
Ping Kuang et al., *A New Architecture for Transparent Electrodes: Relieving the Trade-Off Between Electrical Conductivity and Optical Transmittance*, Adv. Materials 23, 2469 (2011).
R. Malureanu et al., *A new method for obtaining transparent electrodes*, Opt. Express 20, 22770 (2012).
Y. Du et al., *Super terahertz transparent electrodes*, Opt. Express 24, 6359 (2016).
F. J. Garcia De Abajo, *Optical excitations in electron microscopy*, Rev. Mod. Phys. 82, 209 (2010).
H. Huang et al., *Design of broadband graphene-metamaterial absorbers for permittivity sensing at mid-infrared regions*, Sci. Rep. 8, 4183 (2018).
J. Zhu et al., *Ultra-broadband terahertz metamaterial absorber*, Appl. Phys. Lett. 105, 021102 (2014).
P. Yu et al., *Metamaterial perfect absorber with unabated size-independent absorption*, Opt. Express 26, 20471 (2018).
S. T. Bui et al., *Small-size metamaterial perfect absorber operating at low frequency*, Adv. Nat. Sci.: Nanosci. Nanotech. 5, 045008 (2014).
H. Deng et al., *Broadband perfect absorber based on one ultrathin layer of refractory metal*, Opt. Lett. 40, 2592 (2015).
Koji Kimoto, *Practical aspects of monochromators developed for transmission electron microscopy*, Microscopy, 2014, 337-344 (2014).
Krielaart et al., "Potentially Programmable Virtual Phase Plate for Electron Beams", Microscopy and Microanalysis, 25(S2), 92-93 (2019).
Lu et al., *Generation of High-Power, Reversed-Cherenkov Wakefield Radiation in a Metamaterial Structure*, Phys Rev Lett 122:014801 (2009).
H.O. Moser et al.: 11 3D THz metamaterials 1-10 from micro/nanomanufacturing 11, Laster & Photonics Reviews, Sep. 19, 2011 (Sep. 19, 2011), pp. 1-25, XP055017815, ISSN: 1863-8880, DOI: 10.1002/lpor.201000019.
Duan Zhaoyun et al: "Metamaterial-Inspired Vacuum Electron Devices and Accelerators", IEEE Transactions on Electron Devices, IEEE Service Center, Piscataway, NJ, US, vol. 66, No. 1, Jan. 1, 2019 (Jan. 1, 2019), pp. 207-218, XP011694310, ISSN: 0018-9383, DOI: 10.1109/TED.2018.2878242.
Xueying Lu et al: "Interaction of a Volumetric Metamaterial Structure with an Electron Beam", 6th International Particle Accelerator Conference, IPAC2015, Jan. 1, 2015 (Jan. 1, 2015), pp. 2640-2642, XP055605701, DOI: 10.18429/JACoW-IPAC2015-WEPWA060 ISBN: 978-3-95450-168-7.
Don Shiffler et al: "A Cerenkov-like Maser Based on Metamaterial Structure", IEEE Transactions on Plasma Science, IEEE Service Center, Piscataway, NJ, US, vol. 38, No. 6, Jan. 1, 2010 (Jan. 1, 2010), pp. 1462-1465, XP011308500, ISSN: 0093-3813.
International Search Report and Written Opinion issued by the International Searching Authority in related International Patent Application No. PCT/EP2020/052662, dated Apr. 24, 2020 (3 pgs.).
Notice of Reasons for Rejection from the Japan Patent Office issued in related Japanese Patent Application No. 2021-542219; dated Aug. 5, 2022 (11 pgs.).

\* cited by examiner

APPARATUS FOR AND METHOD OF CONTROLLING AN ENERGY SPREAD OF A CHARGED-PARTICLE BEAM

CROSS-REFERENCE TO RELATED APPLICATIONS

This application claims priority to International Application No. PCT/EP2020/052662, filed Feb. 4, 2020, and published as WO 2020/164951 A1, which claims priority of EP application 20153263.7, which was filed on Jan. 23, 2020, EP application 20150384.4, which was filed on Jan. 6, 2020, and EP application 19157009.2, which was filed on Feb. 13, 2019. The contents of these applications are incorporated herein by reference in their entireties.

TECHNICAL FIELD

The embodiments provided herein relate to a charged particle device with one or more charged particle beams, such as an electron microscopy apparatus utilizing one or more electron beams.

BACKGROUND

Integrated circuits are made by creating patterns on a wafer, also called a substrate. The wafer is supported on a wafer stage in the equipment for creating the pattern. One part of the process for making the integrated circuits involves looking at or "inspecting" parts of the wafer. This may be done with a scanning electron microscope or SEM.

The use of SEMs in photolithography increasingly requires low electron probing energies to minimize radiation damage and to mitigate charging effects. Extremely low landing energies are required for SEM observations to allow the subsurface and nanoscale information of target specimens to be measured with minimized charge-up and minimized beam damage depths caused by reduced interaction volumes. As the probing energy is lowered, however, the deleterious effect of the objective lens chromatic aberration becomes pronounced, thereby limiting the achievable spatial resolution. The energy spread of the beam causes chromatic aberration. This spread can be reduced with a monochromator.

SUMMARY

The following presents a simplified summary of one or more embodiments in order to provide a basic understanding of the embodiments. This summary is not an extensive overview of all contemplated embodiments and is not intended to identify key or critical elements of all embodiments nor delineate the scope of any or all embodiments. Its sole purpose is to present some concepts of one or more embodiments in a simplified form as a prelude to the more detailed description that is presented later.

According to an aspect of an embodiment, there is disclosed an apparatus for and method of reducing the energy spread of electrons in an electron beam using a monochromator including metamaterial absorbers.

According to another aspect of an embodiment there is disclosed an apparatus for narrowing an energy spread of an electron beam, the apparatus comprising structure defining a cavity extending along a part of a path of the electron beam, the cavity having an interior surface, and a metamaterial absorber provided on the interior surface. The metamaterial absorber may include a layer of a dielectric material on at least part of the interior surface wherein the layer of a transparent conductive material may be provided with a plurality of absorbing structures. The metamaterial absorber may include a layer of a transparent conductive material on at least part of the interior surface wherein the layer of a transparent conductive material may be provided with a plurality of absorbing structures. The absorbing structures may be metamaterial perfect absorbers. The absorbing structures may be plasmonic structures. The absorbing structures may be configured to resonantly absorb electromagnetic energy. The absorbing structures may be at least partially embedded in the layer of transparent conductive material. The absorbing structures may be fabricated on top of the layer of transparent conductive material. The absorbing structures may be printed on the layer of transparent conductive material. The absorbing structures may comprise a plurality of block-shaped elements comprising a metallic material. The absorbing structures may comprise graphene. The absorbing structures may comprise a plurality of graphene flakes. The absorbing structures may comprise a combination of a plurality of block-shaped metallic elements and a plurality of graphene flakes. The absorbing structures may be arranged in a periodic array. The pitch of the periodic array may be selected to achieve maximum absorption of energy from the electron beam. The transparent conductive material may include indium-tin-oxide. The transparent conductive material may include doped zinc oxide. The transparent conductive material may include carbon nanotubes. The transparent conductive material may comprise an amorphous material. The transparent conductive material may include a doped transparent semiconductor. The transparent conductive material may include a conductive polymer. The transparent conductive material may include a body comprising a transparent material and coating of a conductive material. The coating of a conductive material may include gold. The coating of a conductive material may include aluminum. The coating of a conductive material may include titanium. The coating of a conductive material may include chromium. The structure may include a substantially cylindrical column. A length of the part of the column traversed by the electron beam may be chosen to cause a predetermined amount of deceleration of electrons in the electron beam. The substantially cylindrical column may include an electrically conductive material. The electrically conductive material may include gold. The electrically conductive material may include silver. The electron beam may propagate along a central axis of the column. The radius of the substantially cylindrical column may decrease in a direction the electron beam propagates. The dimensions or pitch of the absorbing structures may vary in a direction in which the electron beam propagates.

According to another aspect of an embodiment there is disclosed an apparatus for generating a substantially monochromatic electron beam, the apparatus comprising a source of an electron beam, a monochromator comprising a metamaterial absorber arranged to interact with the electron beam to produce a substantially monochromatic electron beam, an objective lens arranged to focus the substantially monochromatic electron beam. The monochromator may include a structure defining a cavity having an interior surface and a metamaterial absorber provided on the interior surface. The metamaterial absorber may include a layer of a dielectric material on at least part of the interior surface wherein the layer of a transparent conductive material may be provided with a plurality of absorbing structures. The metamaterial absorber may include a layer of a transparent conductive material on at least part of the interior surface wherein the layer of a transparent conductive material may be provided with a plurality of absorbing structures. The absorbing structures may be metamaterial perfect absorbers. The absorbing structures may be plasmonic structures. The absorbing structures may be configured to resonantly absorb electromagnetic energy. The absorbing structures may be at least partially embedded in the layer of transparent conductive material. The absorbing structures may be fabricated on top of the layer of transparent conductive material. The absorbing structures may be printed on the layer of transparent conductive material. The absorbing structures may comprise a plurality of block-shaped elements comprising a metallic material. The absorbing structures may comprise graphene. The absorbing structures may comprise a plurality of graphene flakes. The absorbing structures may comprise a combination of a plurality of block-shaped metallic elements and a plurality of graphene flakes. The absorbing structures may be arranged in a periodic array. The pitch of the periodic array may be selected to achieve maximum absorption of energy from the electron beam. The transparent conductive material may include indium-tin-oxide. The transparent conductive material may include doped zinc oxide. The transparent conductive material may include carbon nanotubes. The transparent conductive material may comprise an amorphous material. The transparent conductive material may include a doped transparent semiconductor. The transparent conductive material may include a conductive polymer. The transparent conductive material may include a body comprising a transparent material and coating of a conductive material. The coating of a conductive material may include gold. The coating of a conductive material may include aluminum. The coating of a conductive material may include titanium. The coating of a conductive material may include chromium. The structure may include a substantially cylindrical column. A length of the part of the column traversed by the electron beam may be chosen to cause a predetermined amount of deceleration of electrons in the electron beam. The substantially cylindrical column may include an electrically conductive material. The electrically conductive material may include gold. The electrically conductive material may include silver. The electron beam may propagate along a central axis of the column. The radius of the substantially cylindrical column may decrease in a direction the electron beam propagates. The dimensions or pitch of the absorbing structures may vary in a direction in which the electron beam propagates.

According to another aspect of an embodiment there is disclosed an apparatus for generating a substantially monochromatic electron beam, the apparatus comprising a first aperture arranged to obstruct part of the electron beam to produce a modified electron beam, at least one electromagnetic condenser lens arranged to collimate the modified electron beam to produce a collimated electron beam, a second aperture arranged to obstruct part of the collimated electron beam to produce a modified collimated electron beam, a passive monochromator comprising a metamaterial absorber arranged to interact with the modified collimated electron beam to narrow an energy spread of the electron beam, and an objective lens arranged to focus the electron beam from the passive monochromator. The passive monochromator may include a structure defining a cavity having an interior surface and a metamaterial absorber provided on the interior surface. The metamaterial absorber may include a layer of a dielectric material on at least part of the interior surface wherein the layer of a transparent conductive material may be provided with a plurality of absorbing structures. The metamaterial absorber may include a layer of a transparent conductive material on at least part of the interior surface wherein the layer of a transparent conductive material may be provided with a plurality of absorbing structures. The absorbing structures may be metamaterial perfect absorbers. The absorbing structures may be plasmonic structures. The absorbing structures may be configured to resonantly absorb electromagnetic energy. The absorbing structures may be at least partially embedded in the layer of transparent conductive material. The absorbing structures may be fabricated on top of the layer of transparent conductive material. The absorbing structures may be printed on the layer of transparent conductive material. The absorbing structures may comprise a plurality of block-shaped elements comprising a metallic material. The absorbing structures may comprise graphene. The absorbing structures may comprise a plurality of graphene flakes. The absorbing structures may comprise a combination of a plurality of block-shaped metallic elements and a plurality of graphene flakes. The absorbing structures may be arranged in a periodic array. The pitch of the periodic array may be selected to achieve maximum absorption of energy from the electron beam. The transparent conductive material may include indium-tin-oxide. The transparent conductive material may include doped zinc oxide. The transparent conductive material may include carbon nanotubes. The transparent conductive material may comprise an amorphous material. The transparent conductive material may include a doped transparent semiconductor. The transparent conductive material may include a conductive polymer. The transparent conductive material may include a body comprising a transparent material and coating of a conductive material. The coating of a conductive material may include gold. The coating of a conductive material may include aluminum. The coating of a conductive material may include titanium. The coating of a conductive material may include chromium. The structure may include a substantially cylindrical column. A length of the part of the column traversed by the electron beam may be chosen to cause a predetermined amount of deceleration of electrons in the electron beam. The substantially cylindrical column may include an electrically conductive material. The electrically conductive material may include gold. The electrically conductive material may include silver. The electron beam may propagate along a central axis of the column. The radius of the substantially cylindrical column may decrease in a direction the electron beam propagates. The dimensions or pitch of the absorbing structures may vary in a direction in which the electron beam propagates.

According to another aspect of an embodiment, there is disclosed an apparatus for narrowing an energy spread of an electron beam, the apparatus comprising structure defining a cavity extending along a part of a path of the electron beam, the cavity having an interior surface, the interior surface being adapted to absorb energy from electrons in the electron beam to narrow an energy spread of the electron beam. The interior surface may include a metamaterial absorber. The metamaterial absorber may include a layer of a dielectric material on at least part of the interior surface wherein the layer of a transparent conductive material may be provided with a plurality of absorbing structures. The metamaterial absorber may include a layer of a transparent conductive material on at least part of the interior surface wherein the layer of a transparent conductive material may be provided with a plurality of absorbing structures. The absorbing structures may be metamaterial perfect absorbers. The absorbing structures may be plasmonic structures. The absorbing structures may be configured to resonantly absorb electromagnetic energy. The absorbing structures may be at least partially embedded in the layer of transparent conductive material. The absorbing structures may be fabricated on top of the layer of transparent conductive material. The absorbing structures may be printed on the layer of transparent conductive material. The absorbing structures may comprise a plurality of block-shaped elements comprising a metallic material. The absorbing structures may comprise graphene. The absorbing structures may comprise a plurality of graphene flakes. The absorbing structures may comprise a combination of a plurality of block-shaped metallic elements and a plurality of graphene flakes. The absorbing structures may be arranged in a periodic array. The pitch of the periodic array may be selected to achieve maximum absorption of energy from the electron beam. The transparent conductive material may include indium-tin-oxide. The transparent conductive material may include doped zinc oxide. The transparent conductive material may include carbon nanotubes. The transparent conductive material may comprise an amorphous material. The transparent conductive material may include a doped transparent semiconductor. The transparent conductive material may include a conductive polymer. The transparent conductive material may include a body comprising a transparent material and coating of a conductive material. The coating of a conductive material may include gold. The coating of a conductive material may include aluminum. The coating of a conductive material may include titanium. The coating of a conductive material may include chromium. The structure may include a substantially cylindrical column. A length of the part of the column traversed by the electron beam may be chosen to cause a predetermined amount of deceleration of electrons in the electron beam. The substantially cylindrical column may include an electrically conductive material. The electrically conductive material may include gold. The electrically conductive material may include silver. The electron beam may propagate along a central axis of the column. The radius of the substantially cylindrical column may decrease in a direction the electron beam propagates. The dimensions or pitch of the absorbing structures may vary in a direction in which the electron beam propagates.

According to another aspect of an embodiment there is disclosed a method of reducing a width of an energy distribution in a beam of electrons, the method comprising the step of passing the beam through a volume of space defined by a structure extending along a path of the beam, the surface being provided with a metamaterial absorber arranged to absorb energy from the electrons. The metamaterial absorber may include a layer of a transparent conductive material on at least part of the interior surface wherein the layer of a transparent conductive material may be provided with a plurality of absorbing structures. The metamaterial absorber may include a layer of a dielectric material on at least part of the interior surface wherein the layer of a transparent conductive material may be provided with a plurality of absorbing structures. The metamaterial absorber may include a layer of a transparent conductive material on at least part of the interior surface wherein the layer of a transparent conductive material may be provided with a plurality of absorbing structures. The absorbing structures may be metamaterial perfect absorbers. The absorbing structures may be plasmonic structures. The absorbing structures may be configured to resonantly absorb electromagnetic energy. The absorbing structures may be at least partially embedded in the layer of transparent conductive material. The absorbing structures may be fabricated on top of the layer of transparent conductive material. The absorbing structures may be printed on the layer of transparent conductive material. The absorbing structures may comprise a plurality of block-shaped elements comprising a metallic material. The absorbing structures may comprise graphene. The absorbing structures may comprise a plurality of graphene flakes. The absorbing structures may comprise a combination of a plurality of block-shaped metallic elements and a plurality of graphene flakes. The absorbing structures may be arranged in a periodic array. The pitch of the periodic array may be selected to achieve maximum absorption of energy from the electron beam. The transparent conductive material may include indium-tin-oxide. The transparent conductive material may include doped zinc oxide. The transparent conductive material may include carbon nanotubes. The transparent conductive material may comprise an amorphous material. The transparent conductive material may include a doped transparent semiconductor. The transparent conductive material may include a conductive polymer. The transparent conductive material may include a body comprising a transparent material and coating of a conductive material. The coating of a conductive material may include gold. The coating of a conductive material may include aluminum. The coating of a conductive material may include titanium. The coating of a conductive material may include chromium. The structure may include a substantially cylindrical column. A length of the part of the column traversed by the electron beam may be chosen to cause a predetermined amount of deceleration of electrons in the electron beam. The substantially cylindrical column may include an electrically conductive material. The electrically conductive material may include gold. The electrically conductive material may include silver. The electron beam may propagate along a central axis of the column. The radius of the substantially cylindrical column may decrease in a direction the electron beam propagates. The dimensions or pitch of the absorbing structures may vary in a direction in which the electron beam propagates.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF FIGURES

The accompanying drawings, which are incorporated herein and form part of the specification, illustrate the present invention and, together with the description, further serve to explain the principles of the present invention and to enable a person skilled in the relevant art(s) to make and use the present invention.

DETAILED DESCRIPTION

Figure 1:
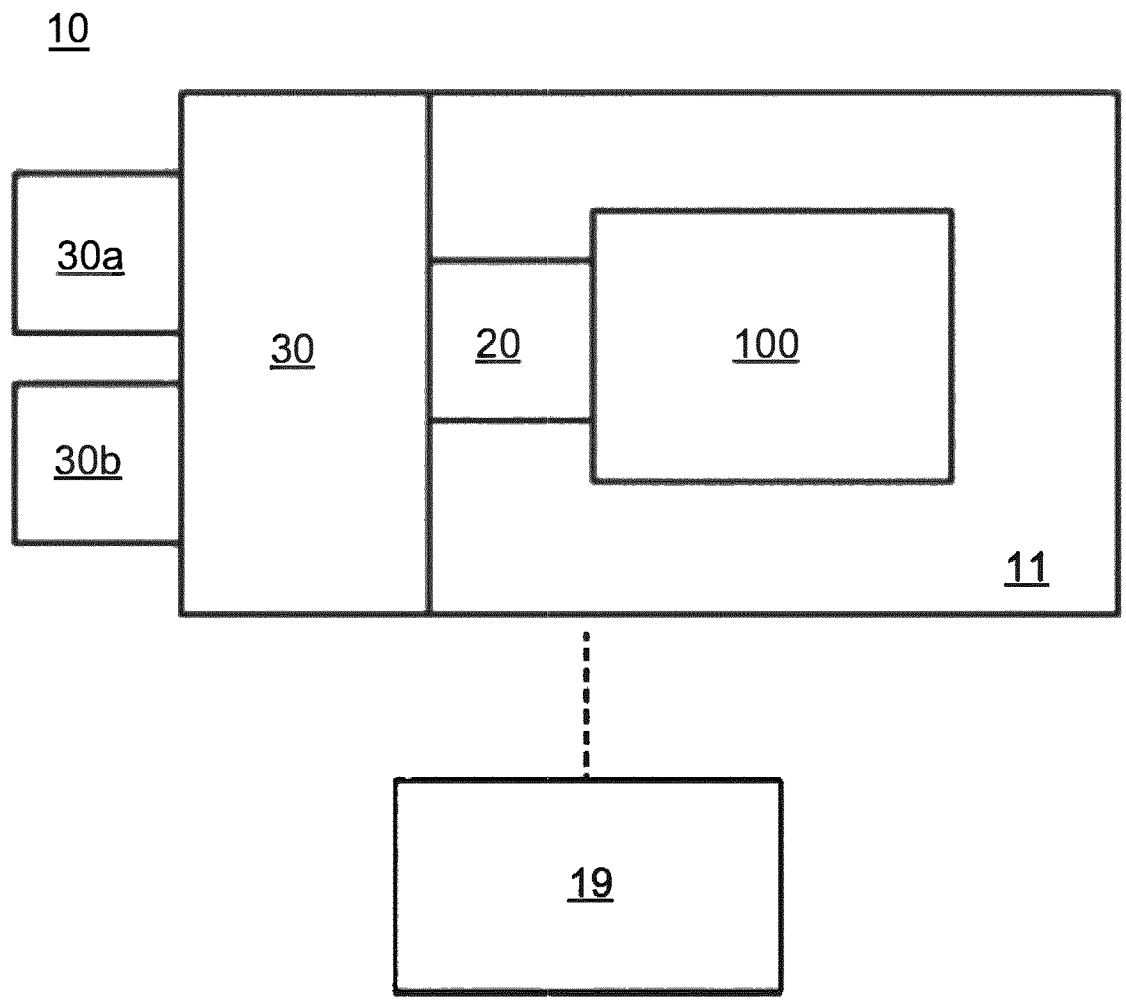
FIG. 1 is a schematic diagram illustrating an exemplary electron beam inspection system, consistent with some embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of systems, apparatus, and methods consistent with aspects related to the invention as recited in the appended claims Relative dimensions of components in drawings may be exaggerated for clarity.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than $\frac{1}{1000}$th the size of a human hair.

Making these extremely small ICs is a complex, time-consuming, and expensive process, often involving hundreds of individual steps. Errors in even one step have the potential to result in defects in the finished IC rendering it useless. Thus one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective then the process can be adjusted so the defect is less likely to recur.

As the name implies, SEMs use beams of electrons because such beams can be used to see structures that are too small to be seen by optical microscopes, that is, microscopes using light. The electrons in the electron beam(s) will not all have exactly the same energy. Instead, there will be a spread in the energy which is sometimes referred to as $\Delta E$. It is desirable when obtaining an SEM image, however, to use electrons having energies as close together as possible. In other words it is desirable to make $\Delta E$ as small as possible. A beam in which all of the electrons have nearly the same energy is referred to as monochromatic. Similarly, a device that makes the energy spread of the beam smaller is referred to as a monochromator.

A monochromator typically separates electrons with different energies, and uses a slit to select electrons with the right energy and block the others, that is, the slit allows through electrons having the desired energy and blocks electrons not having the right energy. In such a monochromator, electrons with different energies are separated and discarded and only a small portion of electrons with desired energy are selected, resulting in an electron beam that includes only a fraction of the generated electrons. The cost of improving imaging resolution using such a monochromator is thus to lose most of electrons in an electron beam, resulting in reduced throughput of a SEM. One way around this problem is to keep all of the electrons but to slow some of them down so that they all have about the same energy. Usually this requires passing the electrons through different electric fields, which adds complications. It would be advantageous to be able to decelerate the faster electrons so that the electrons' speeds match using a device that reduces the electron energy passively, that is, without having to impose an external electric field.

A design of typical monochromator may introduce obstacles in achieving monochromatic electrons. For example, if a diameter of monochromator is large, the physical processes responsible for reducing an energy spread become weak requiring a longer column of a SEM to manipulate a beam as the beam propagates through the column. On the other hand, if the diameter is reduced to strengthen the physical effects, it may result in transmission loss or diffraction effects. Moreover, fabrication of a monochromator inside the inner wall of a SEM column could be challenging and restrict alternatives for absorbing structures on the inner wall of the SEM.

In some embodiments of disclosures in this application, a system is provided that includes an absorber that effectively siphons off the electron energy in such a way that the electrons all end up with about the same amount of energy. Of course, this is a simplistic description, and the actual details are set forth more completely and precisely below. In some embodiments of such systems, absorbers may be provided on the inside surface of a cylinder through which electrons pass to form an electron beam. To facilitate the absorbers absorbing energy from overly energetic electrons, the electrons need to pass sufficiently close to the absorbers, which creates a challenge in the design of the cylinder as it may need to have a diameter sufficiently small that substantially all of the electrons pass within a certain small distance of an absorber.

In other embodiments, in order to facilitate passing the electrons sufficiently close to an absorber, the electrons can be directed to a mirror plate and the absorbers can be mounted on mirror plate. The mirror plate can be a programmable mirror plate configured to correct aberrations in an electron beam or beams. Each pixel in the mirror plate is connected to a voltage configured to cause the mirror plate to generate an electric field configured to correct aberrations of the beam. As electrons of the beam approach a mirror plate, they also approach an absorber mounted on the mirror plate. The electric field generated by the mirror plate repels the electrons in such a way as to correct for the aberrations. Further, the electrons pass sufficiently close to the absorber before being reflected that the desired energy absorption by the absorber takes place, with the result that substantially all the reflected electrons have a similar energy.

To enhance performance of a SEM system, it would be desirable to correct for aberration without reducing beam current, and without inhibiting the operation flexibility of the SEM system. For example, it may be desirable to maintain a wide range of adjustability of parameters of a SEM system, such as primary beam energy, beam opening angle, and energy of secondary electrons arriving on a detector.

Without limiting the scope of the present disclosure, descriptions and drawings of embodiments may be exemplarily referred to as using an electron beam. However, the embodiments are not used to limit the present invention to specific charged particles. For example, systems and methods for beam forming may be applied to photons, x-rays, and ions, etc. Furthermore, the term "beam" may refer to primary electron beams, primary electron beamlets, secondary electron beams, or secondary electron beamlets, among others.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

In the description and in the claims the terms "up," "down," "top," "bottom," "vertical," "horizontal," and like terms may be employed. These terms are intended to show relative orientation only and not any absolute orientation such as orientation with respect to gravity unless otherwise intended as indicated. Similarly, terms such as left, right, front, back, etc., are intended to give only relative orientation.

Reference is now made to FIG. 1, which illustrates an exemplary electron beam inspection (EBI) system 10, consistent with some embodiments of the present disclosure. As shown in FIG. 1, EBI system 10 includes a main chamber 11, a load/lock chamber 20, an electron beam tool 100, and an equipment front end module (EFEM) 30. Electron beam tool 100 is located within main chamber 11.

EFEM 30 includes a first loading port 30a and a second loading port 30b. EFEM 30 may include additional loading port(s). First loading port 30a and second loading port 30b may, for example, receive wafer front opening unified pods (FOUPs) that contain wafers (e.g., semiconductor wafers or wafers made of other material(s)) or samples to be inspected (wafers and samples may be collectively referred to as "wafers" hereafter). One or more robotic arms (not shown) in EFEM 30 may transport the wafers to load/lock chamber 20.

Load/lock chamber 20 is connected to a load/lock vacuum pump system (not shown) that removes gas molecules in load/lock chamber 20 to reach a first pressure below the atmospheric pressure. After reaching the first pressure, one or more robotic arms (not shown) may transport the wafer from load/lock chamber 20 to main chamber 11. Main chamber 11 is connected to a main chamber vacuum pump system (not shown), which removes gas molecules in main chamber 11 to reach a second pressure below the first pressure. After reaching the second pressure, the wafer is subject to inspection by electron beam tool 100. Electron beam tool 100 may be a single-beam system, a multi-beam system, or a multi-column system, or a combination of these. A controller 19 is electronically connected to electron beam tool 100. While controller 19 is shown in FIG. 1 as being outside of the structure that includes main chamber 11, load/lock chamber 20, and EFEM 30, it is appreciated that controller 19 may be part of the structure.

While the present disclosure provides examples of main chamber 11 housing an electron beam inspection system, it should be noted that aspects of the disclosure in their broadest sense, are not limited to a chamber housing an electron beam inspection system. Rather, it is appreciated that the principles discussed herein may also be applied to other tools that operate under the second pressure.

Figure 2:
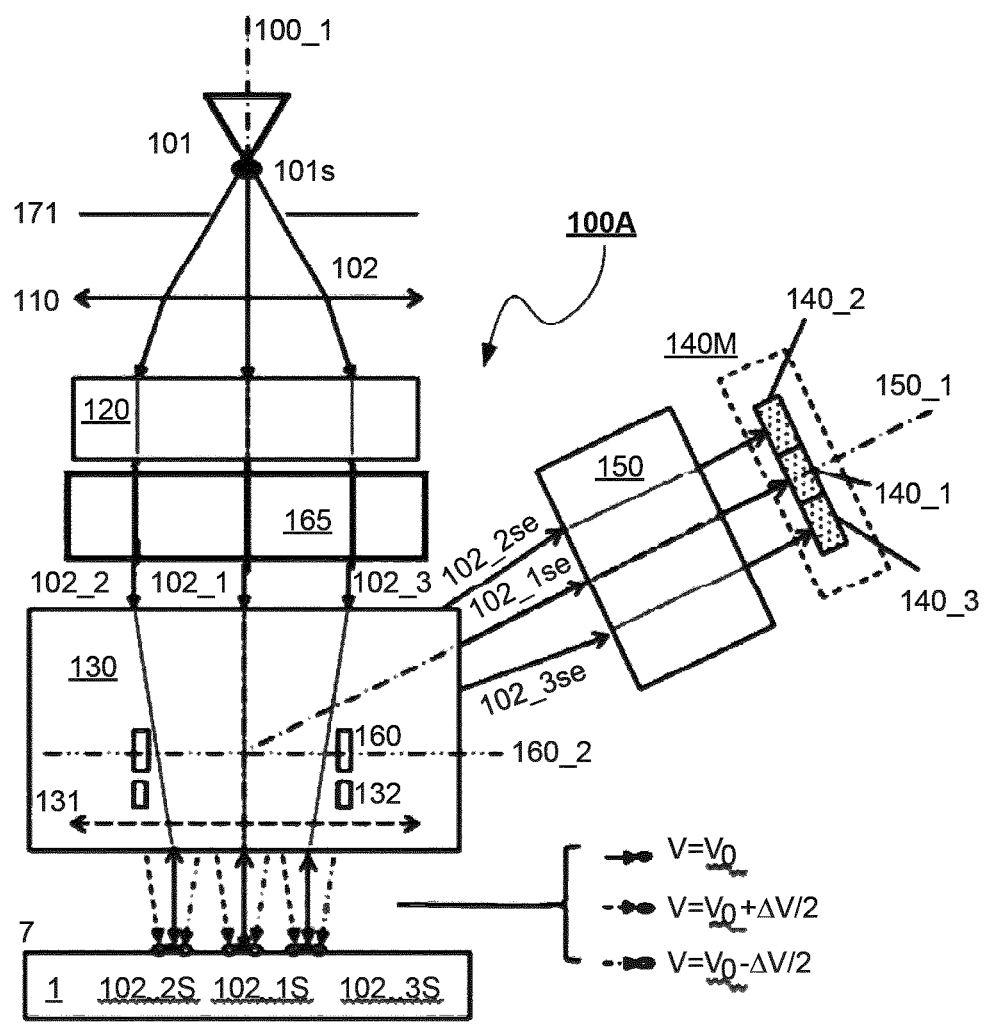
FIG. 2 is a schematic diagram illustrating additional aspects of an exemplary electron beam inspection system, consistent with some embodiments of the present disclosure.

FIG. 2 illustrates an exemplary electron beam tool 100A that may be part of the EBI system of FIG. 1. An electron beam tool 100A (also referred to herein as "apparatus 100A") comprises an electron source 101, a gun aperture plate 171, a condenser lens 110, a source conversion unit 120, a primary projection optical system 130, a secondary imaging system 150, and an electron detection device 140M. Primary projection optical system 130 may comprise an objective lens 131. A sample 1 with sample surface 7 may be provided on a movable stage (not shown). Electron detection device 140M may comprise a plurality of detection elements 140_1, 140_2, and 140_3. A beam separator 160 and a deflection scanning unit 132 may be placed inside primary projection optical system 130.

Electron source 101, gun aperture plate 171, condenser lens 110, source conversion unit 120, beam separator 160, deflection scanning unit 132, and primary projection optical system 130 may be aligned with a primary optical axis 100_1 of apparatus 100A. Secondary imaging system 150 and electron detection device 140M may be aligned with a secondary optical axis 150_1 of apparatus 100A.

Electron source 101 may comprise a cathode (not shown) and an extractor or anode (not shown), in which, during operation, electron source 101 is configured to emit primary electrons from the cathode and the primary electrons are extracted or accelerated by the extractor or the anode to form a primary electron beam 102 that forms a primary beam crossover (virtual or real) 101s. Primary electron beam 102 may be visualized as being emitted from primary beam crossover 101s.

Source conversion unit 120 may comprise an image-forming element array (not shown in FIG. 2) and a beam-limit aperture array (not shown in FIG. 2). The image-forming element array may comprise a plurality of micro-deflectors or micro-lenses that may influence a plurality of primary beamlets 102_1, 102_2, 102_3 of primary electron beam 102 and form a plurality of parallel images (virtual or real) of primary beam crossover 101s, one for each of the primary beamlets 102_1, 102_2, 102_3. The beam-limit aperture array may be configured to limit diameters of individual primary beamlets 102_1, 102_2, and 102_3. FIG. 2 shows three primary beamlets 102_1, 102_2, and 102_3 as an example, and it is appreciated that source conversion unit 120 may be configured to form any number of primary beamlets. For example, source conversion unit 120 may be configured to form a 3×3 array of primary beamlets. Source conversion unit 120 may further comprise an aberration compensator array configured to compensate aberrations of probe spots, 102_1S, 102_2S, and 102_3S. In some embodiments, the aberration compensator array may include a field curvature compensator array with micro-lenses that are configured to compensate field curvature aberrations of probe spots, 102_1S, 102_2S, and 102_3S, respectively. In some embodiments, the aberration compensator array may include an astigmatism compensator array with micro-stigmators that are configured to compensate astigmatism aberrations of probe spots, 102_1S, 102_2S, and 102_3S, respectively. In some embodiments, the image-forming element array, the field curvature compensator array, and the astigmatism compensator array may comprise multiple layers of micro-deflectors, micro-lenses, and micro-stigmators, respectively.

Condenser lens 110 is configured to focus primary electron beam 102. Condenser lens 110 may further be configured to adjust electric currents of primary beamlets 102_1, 102_2, and 102_3 downstream of source conversion unit 120 by varying the focusing power of condenser lens 110. Beamlets 102_1, 102_2, and 102_3 may thereby have a focusing status that may be changed by condenser lens 110. Alternatively, the electric currents may be changed by altering the radial sizes of beam-limit apertures within the beam-limit aperture array corresponding to the individual primary beamlets. Thus, current of a beamlet may be different at different locations along the beamlet's trajectory. Beamlet current may be adjusted so that current of the beamlet on the sample surface (e.g., probe spot current) is set to a desired amount.

Condenser lens 110 may be a movable condenser lens that may be configured so that the position of its first principle plane is movable. The movable condenser lens may be configured to be magnetic, or electrostatic, or electromagnetic (e.g., compound). A movable condenser lens is further described in U.S. Pat. No. 9,922,799 and U.S. Patent Application Pub. No. 2017/0025243, both of which are incorporated herein in their entirety. In some embodiments, the condenser lens may be an anti-rotation lens, which may keep rotation angles of off-axis beamlets unchanged while varying the electric currents of the beamlets. In some embodiments, condenser lens 110 may be a movable anti-rotation condenser lens, which involves an anti-rotation lens with a movable first principal plane. An anti-rotation or movable anti-rotation condenser lens is further described in International Application No. PCT/EP2017/084429, which is incorporated by reference in its entirety.

Objective lens 131 may be configured to focus beamlets 102_1, 102_2, and 102_3 onto sample 1 for inspection and may form, in the current embodiment, three probe spots 102_1S, 102_2S, and 102_3S on surface 7. Gun aperture plate 171, in operation, is configured to block off peripheral electrons of primary electron beam 102 to reduce Coulomb interaction effect. The Coulomb interaction effect may enlarge the size of each of probe spots 102_1S, 102_2S, and 102_3S of primary beamlets 102_1, 102_2, 102_3, and therefore deteriorate inspection resolution. Also shown is a beam monochromator 165, as will be described in more detail below.

Deflection scanning unit 132, in operation, is configured to deflect primary beamlets 102_1, 102_2, and 102_3 to scan probe spots 102_1S, 102_2S, and 102_3S across individual scanning areas in a section of surface 7. In response to illumination of sample 1 by primary beamlets 102_1, 102_2, and 102_3 at probe spots 102_1S, 102_2S, and 102_3S, secondary electrons emerge from sample 1 and form three secondary electron beams 102_1se, 102_2se, and 102_3se, which, in operation, are emitted from sample 1. Each of secondary electron beams 102_1se, 102_2se, and 102_3se typically comprise electrons having different energies including secondary electrons (having electron energy ≤50 eV) and backscattered electrons (having electron energy between 50 eV and the landing energy of primary beamlets 102_1, 102_2, and 102_3). Secondary imaging system 150 subsequently focuses secondary electron beams 102_1se, 102_2se, and 102_3se onto detection elements 140_1, 140_2, and 140_3 of electron detection device 140M. Detection elements 140_1, 140_2, and 140_3 are arranged to detect corresponding secondary electron beams 102_1se, 102_2se, and 102_3se and generate corresponding signals that may be sent to signal processing units (not shown) to, for example, construct images of the corresponding scanned areas of sample 1.

Figure 3:
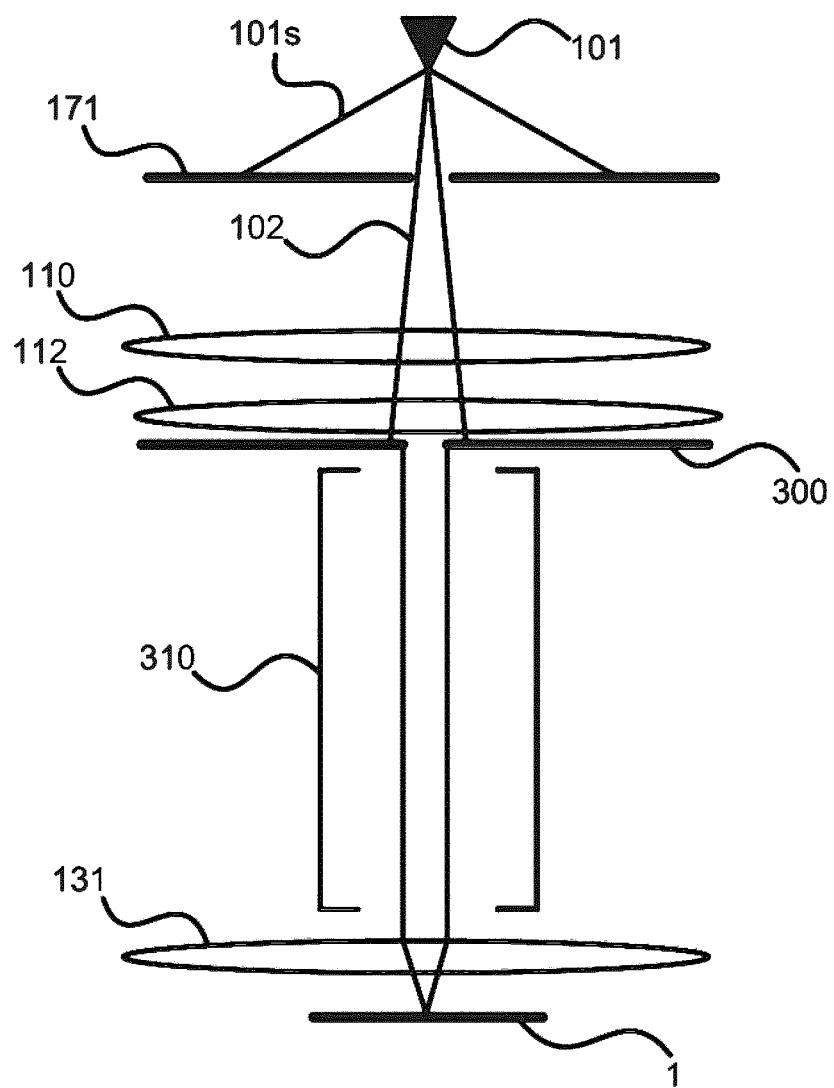
FIG. 3 is a side view diagram illustrating additional aspects of an exemplary electron beam inspection system, consistent with some embodiments of the present disclosure.

FIG. 3 illustrates an arrangement according to one aspect of an embodiment. In such a system, an electron source 101 is used to generate a large amount of electrons 101s. Aperture 171 is used to remove unnecessary electrons so that Coulomb interactions will be well mitigated. This results in beam 102. Condenser lenses 110 and 112 collimate the electron beam 102. Together with aperture 300, condenser lenses 110 and 112 can be used to change the beam current. A passive monochromator 310 (to be used, for example, as the monochromator 165 in FIG. 2) is provided below, i.e., downbeam from the aperture 300. The function of the passive monochromator 310 is to reduce the energy spread of the electron beam 102. Then an objective lens 131 is used to focus this electron beam 102 on a sample 1.

Figure 4A:
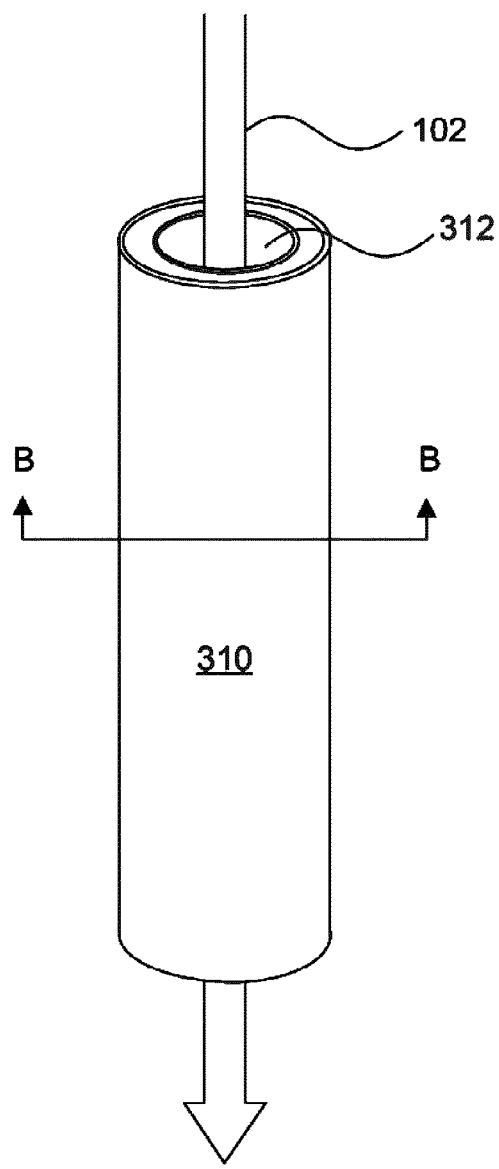
FIG. 4A is a partially perspective view of a monochromator such as one could be used in the system of FIG. 3.
Figure 4B:
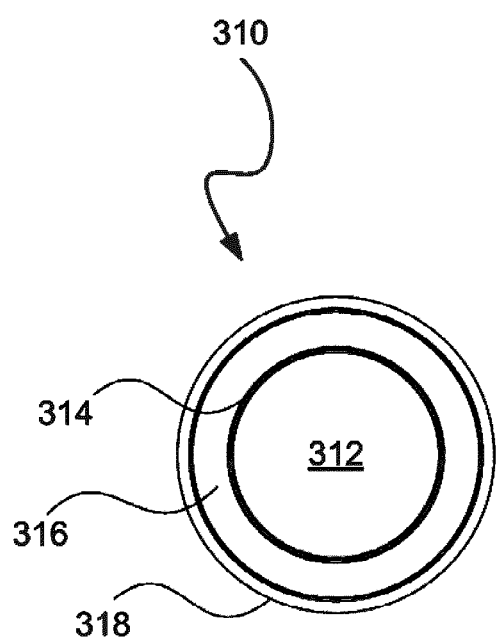
FIG. 4B is a cross section of FIG. 4A taken along line B-B.

FIG. 4A is a partially perspective view of the passive monochromator 310 shown in FIG. 3. As can be seen, the passive monochromator 310 includes a structure defining a cavity 312 (FIG. 4B) through which the electron beam 102 passes. The cavity 312 may be hollow or it may enclose a material transparent to light or to the electron beam. As shown, the structure may be substantially cylindrical and have a central axis which coincides with the path of the electron beam 102. As shown in FIG. 4B, which is a cross section of the arrangement of FIG. 4A taken along line B-B, surrounding the cavity 312 is a layer of absorbing structures 314 as will be described in more detail below. This layer of absorbing structures 314 is provided on a layer 316 comprising, for example, a dielectric material or a transparent conductive material. A transparent conductive material would conduct stray electrons impinging on the layer 316 away from the device and avoid charging of the walls. In circumstances in which the flux of stray electrons is not expected to be significant, for example, if the beam is sufficiently collimated, or when possible charging is not visible for the charged-particle beam, then a dielectric material may be used. Numeral 318 denotes the outer wall of the structure which is made of an electrically conductive material. The electrically conductive material may comprise, for example, gold or silver.

Figure 5:
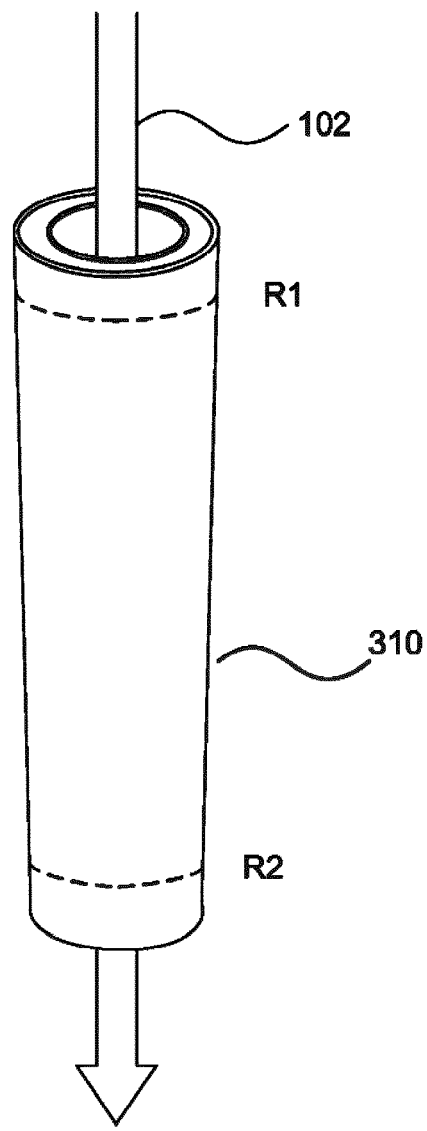
FIG. 5 is a partially perspective view of a monochromator such as one could be used in the system of FIG. 3.

In the arrangement of FIG. 4A, the outer configuration of the passive monochromator 310 is substantially cylindrical. For some applications, however, it may be beneficial to alter the radius of the passive monochromator 310 as a function of position on the beam axis such that the passive monochromator 310 has a first radius where the beam 102 enters the passive monochromator 310 and a second radius where the beam 102 exits the passive monochromator 310. In the example shown in FIG. 5, the circumference R1 is greater than the circumference R2 so that the overall configuration of the passive monochromator 310 is frustoconical. This configuration may make the passive monochromator 310 more efficient at absorbing energy from the electrons in the electron beam 102.

As mentioned above, the passive monochromator 310 may be realized by embedding absorbing structures which resonantly absorb electromagnetic energy at wavelengths determined by the material of which they are composed and to their geometrical features. Due to absorption efficiency reaching almost 100%, these structures are known as plasmonic/metamaterial perfect absorbers. Note that these structures are referred to as "perfect" absorbers in the literature and in this application even though their absorption efficiency is less than 100%.

Figure 6:
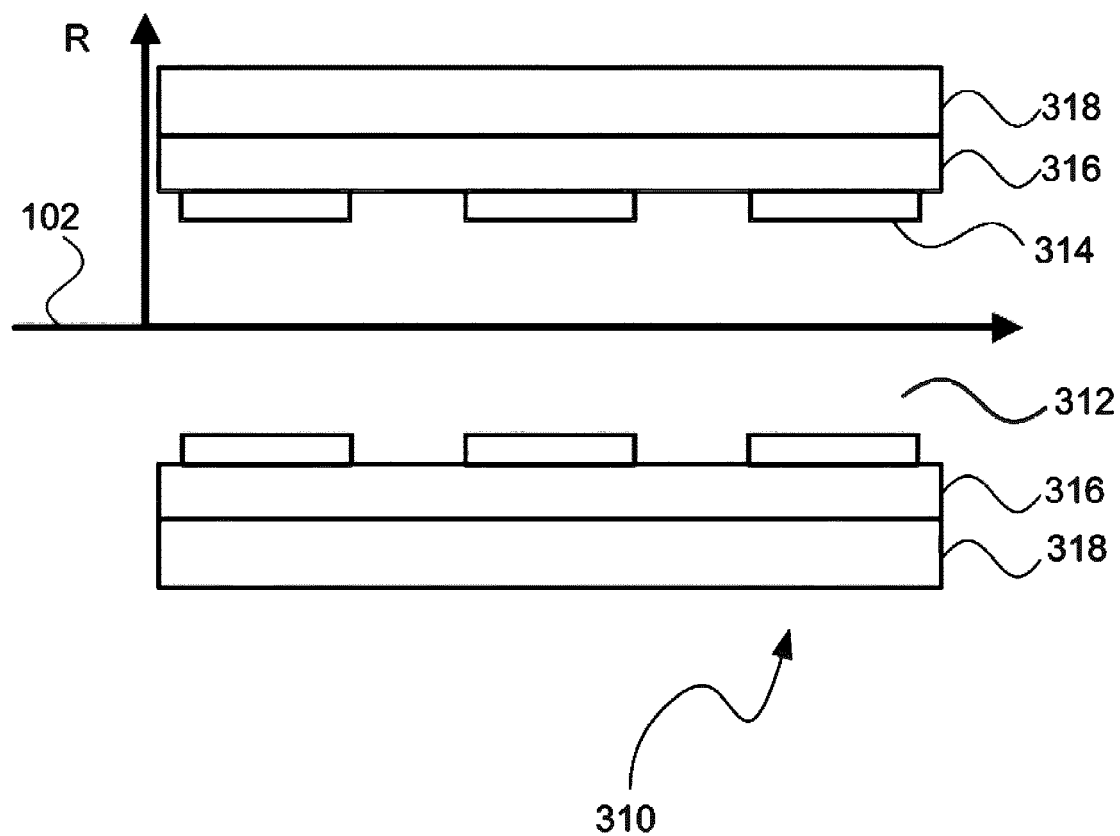
FIG. 6 is a cross sectional view of the monochromator of FIG. 4A.

FIG. 6 schematically shows a plane through the passive monochromator 310 which has these absorbing structures 314 embedded in or coupled to an inner wall. These absorbing structures 314 may take any one of a number of forms such as metallic blocks, graphene flakes or a combination of both, printed atop a layer 316 disposed on a metallic wall 318. Other configurations such as graphene ribbons are also known and within the scope of this disclosure.

Figure 7:
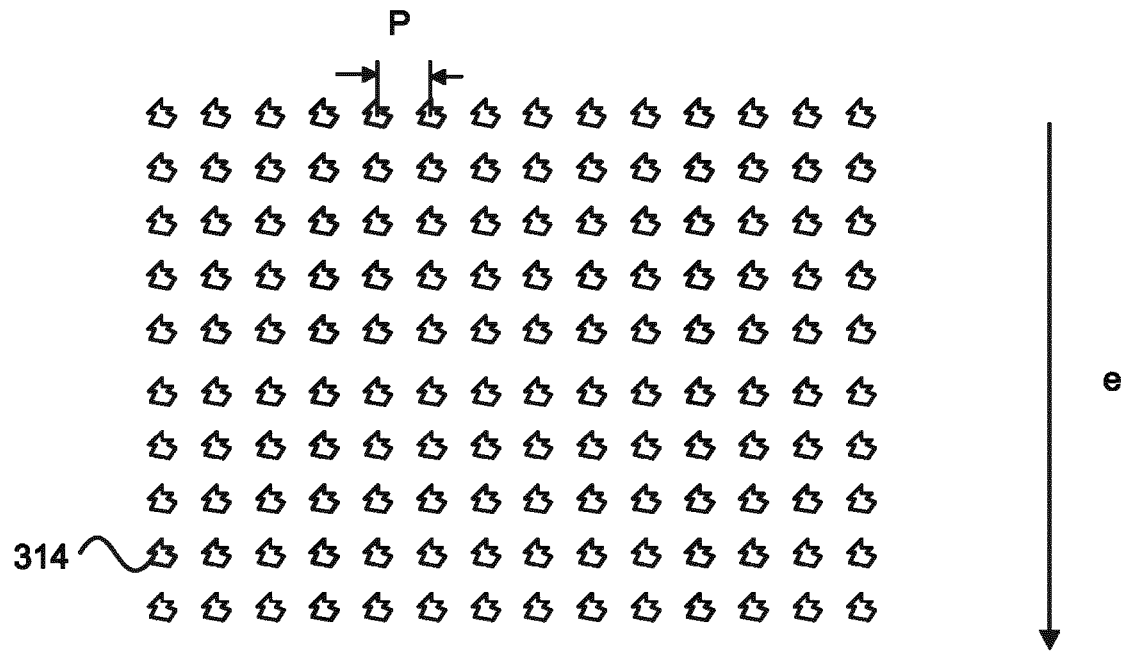
FIG. 7 is a plan view of a metamaterial absorber according to an aspect of an embodiment
Figure 8:
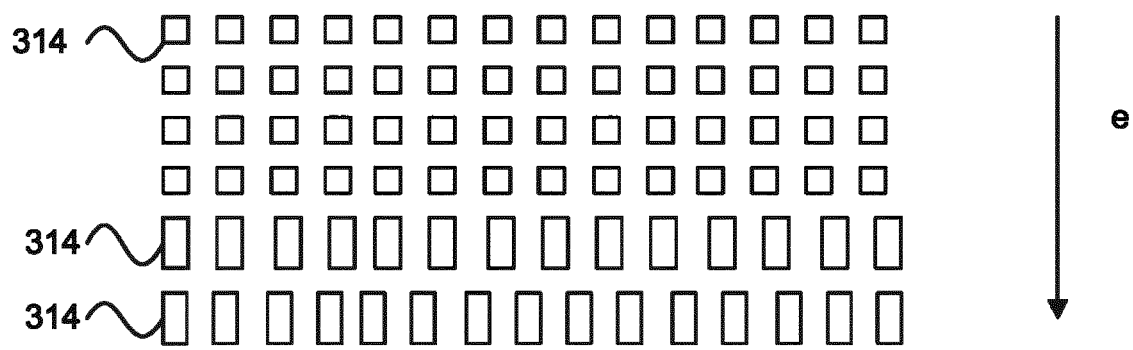
FIG. 8 is a plan view of a metamaterial absorber according to an aspect of an embodiment.

FIG. 7 is a diagrammatic plan view of absorbing structures 314 and embedded in or coupled to a layer, such as layer 316, which may be a transparent electrode. In the particular arrangement shown, the absorbing structures 314 are graphene flakes but, as stated above, other absorbing structures may be used. The absorbing structures 314 together with the layer 316 comprise what is referred to as perfect absorber or as a metamaterial absorber, that is, a material engineered to efficiently absorb electromagnetic radiation. It will be seen that the absorbing structures 314 are embedded in or coupled to the layer 316 in a periodic array having a pitch P. In addition to tuning of the performance of the metamaterial absorber by choosing the geometry (shape and dimensions) and material for the absorbing structures 314, the performance of the metamaterial absorber can also be tuned by altering the pitch P. For instance, at the beginning of the column, the absorbing structures 314 can be selected to interact efficiently with energetic electrons and later in the column the absorbing structures can be selected and configured to decelerate more efficiently the less energetic electron. FIG. 8 shows a metamaterial absorber implemented as an array of metallic blocks 314. The blocks are varied in terms of shape and pitch in the direction of propagation of the electron beam e.

As discussed above, it is desirable in some applications to use a transparent electrode which acts as a dielectric with respect to electromagnetic radiation but which conducts charges. The transparent conductive electrode may for example be indium-tin-oxide, doped zinc oxide, carbon nanotubes, amorphous material, a doped transparent semiconductor, or a conductive polymer. The transparent conductive electrode may for example be a transparent material and coating of a conductive material with the coating, for example, being gold, aluminum, titanium, or chromium.

The deceleration of electrons is a function of electron velocity or energy. Highly energetic electrons interact strongly with electromagnetic modes at a particular frequency than the less energetic electrons. As a result, energetic electrons will also decelerate more than less energetic ones. Once the electrons have decelerated sufficiently, their interaction with absorbers will become so weak that the electrons will cease to exhibit any noticeable shift in their energy. Hence, the output electron beam will have electrons with substantially identical energies. Additionally, the length of the part of the monochromator traversed by the electron beam may also be chosen such as to cause only a predetermined amount of deceleration of the incident electrons.

While the above arrangement is described in connection with its use as a monochromator, it would be equally useful to passively downconvert the electron beam energy without applying decelerating potentials.

In general, there are many candidates for metamaterial absorbing structures each having its own advantages. In practice, design constraints imposed by a particular application will determine selection of the best candidate. For example, in accordance with one aspect of an embodiment, it may be desirable to decelerate the electrons by absorbing in the optical band or the THz band. Metamaterial absorber structures may take the form of a graphene micro-ribbon or potentially even a flat film.

Figure 9:
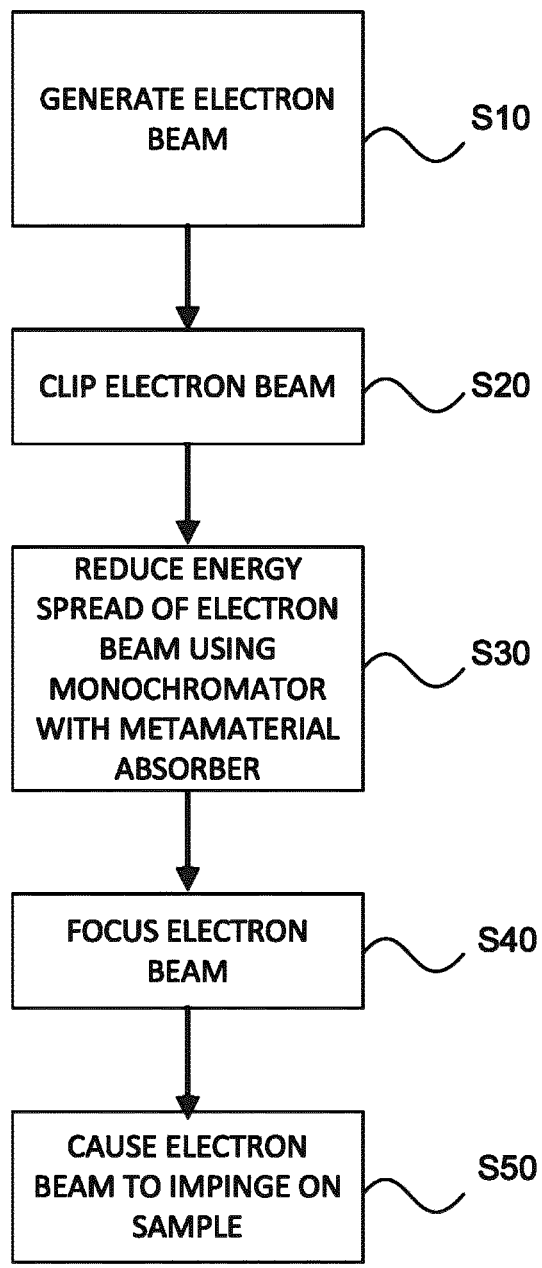
FIG. 9 is a flowchart showing exemplary steps in a method according to an aspect of an embodiment.

According to another aspect of an embodiment, there is disclosed a method of using a metamaterial absorber to reduce the energy spread of an electron beam. With reference to FIG. 9 in a first step S10 the electron beam is generated. Then, in a step S20, the electron beam is "clipped", that is, passed through an aperture. In a step S30 the energy spread of electron beam is reduced using a monochromator with a metamaterial absorber. In a step S40 the electron beam which is at this point substantially monochromatic is focused, generally using an objective lens. In a step S50 the focused electron beam is caused to impinge on a sample to illuminate the sample with the electron beam.

Figure 10A:
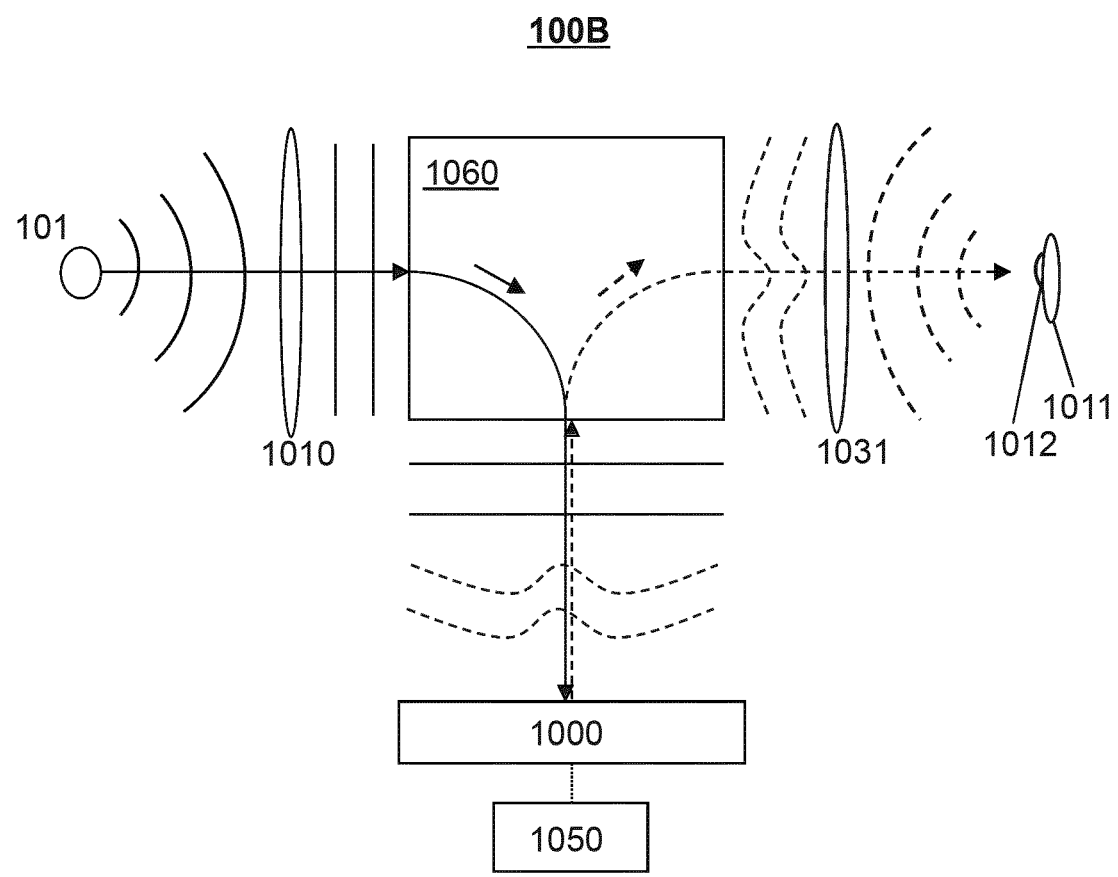
FIG. 10A illustrates an exemplary electron beam tool that may be part of the charged particle inspection system of FIG. 1, consistent with some embodiments of the present disclosure.

FIG. 10A illustrates an exemplary electron beam tool 100B that may be part of the charged particle inspection system of FIG. 1, consistent with some embodiments of the present disclosure. An electron beam tool 100B (also referred to herein as apparatus 100B) comprises an electron source 101, a first lens 1010, a second lens 1031, a beam separator 1060, a programmable charged-particle mirror plate 1000, and a voltage control 1050. Other components commonly present such as apertures and deflectors are not shown in FIG. 10A for the purpose of simplicity. A sample 1011 with sample surface 1012 may be provided on a movable stage (not shown). Electron source 101, lens 1010, and lens 1031 may be aligned with a primary optical axis of apparatus 100B.

Electron source 101 may comprise a cathode (not shown) and an extractor or anode (not shown), in which, during operation, electron source 101 is configured to emit primary electrons from the cathode and the primary electrons are extracted or accelerated by the extractor or the anode to form a primary electron beam shown as a series of wavefronts, that is, surfaces, surface, real or imaginary, at which the phase of oscillation is the same. As can be seen, the wavefront of the beam as emitted by the source 101 is shown to be essentially spherical.

Beam separator 1060, mirror plate 1000, and voltage control 1050 are introduced into the beam path to correct for aberrations. Beam separator 1060, mirror plate 1000, and voltage control 1050 are introduced between the lenses to pre-shape the wavefront so that the net effect of the pre-shaping and aberrations is a more properly focused beam. It will be understood as described in more detail below that the placement of beam separator 1060, mirror plate 1000, and voltage control 1050 in apparatus 100B is merely an example, and that beam separator 1060, mirror plate 1000, and voltage control 1050 may be placed in other positions in the apparatus 100B.

Beam separator 1060 may be a beam separator of Wien filter type that may generate an electrostatic dipole field and a magnetic dipole field. In some embodiments, the force exerted by electrostatic dipole field on an electron of beamlets may be equal in magnitude and opposite in direction to the force exerted on the electron by magnetic dipole field. Beamlets can therefore pass straight through beam separator 1060 with zero deflection angle. However, the total dispersion of beamlets generated by beam separator 1060 may also be non-zero. Beam separator 1060 can guide an incoming beamlet towards mirror plate 1000 and further guide a reflected beam from mirror plate 1000 into another direction. Mirror plate 1000 can correct aberrations of the incoming beamlet and reflect the corrected beamlet toward beam separator 1060.

Also, in the examples described below, mirror plate 1000 is described primarily in terms of correcting aberrations created by lenses. Mirror plate 1000 can also or alternatively, however, be used to shape the charged particle beam. For example, mirror plate 1000 may be used to make the beam cross-sectional profile ring-shaped instead of spot-shaped on the sample. This may provide advantages in certain applications such as for imaging the side walls of contact holes. As another example, the beam profile could be made to diverge less at the wafer to create a larger depth-of-focus.

In some embodiments, apparatus 100B may comprise additional optical elements (such as electrodes) paired with adjustable voltages or magnetic optical elements paired with adjustable excitation placed between mirror plate 1000 and the separator 1060 to further influence electric and magnetic fields to correct aberrations. A plurality of drivers can be coupled with electrodes or magnetic optical elements, wherein each of the plurality of drivers can be configured to provide adjustable voltages or adjust excitations to the corresponding electrode or the corresponding magnetic optical element, respectively. The additional optical elements, coupled with mirror plate 1000, can be used to correct for possible additional aberrations caused by lens 1010 or beam separator 1060, like those caused by multipole fields. For instance, in one example implementation, mirror plate 1000 can be used to correct rotational symmetric aberrations or non-symmetric aberrations, while the additional optical elements can be used to correct non-symmetric aberrations caused by multipole fields.

Mirror plate 1000 may reflect the beamlet above the mirror surface by applying a negative or positive overall voltage on mirror plate 1000. For example, voltage control 1050 may apply negative overall voltage to mirror plate 1000 to reflect electrons (or negative ions) from the beamlet. In another example, voltage control 1050 may apply positive overall voltage to mirror plate 1000 to reflect positively charged particles (or positive ions) from the beamlet. The beamlet is reflected toward beam separator 1060, where the reflected beamlet is guided into another direction and can be focused on a sample. FIG. 10A shows a beamlet that is bent at 90 degrees, and it is appreciated that the beamlet can be bent at other angles. Moreover, mirror plate 1000 can be further configured to reflect only one of multiple beamlets.

In some embodiments, mirror plate 1000 and voltage control 1050 may be implemented in separate components. In some other embodiments, mirror plate 1000 and voltage control 1050 may be implemented in a single component.

In some implementations, a second mirror plate can be provided to reflect a beamlet which has been reflected by mirror plate 1000 inside apparatus 100B. For example, a reflected beamlet from mirror plate 1000 can be directed to a second mirror plate implemented within apparatus 100B, such as near to beam separator 1060. The second mirror plate may reflect an incoming beamlet from beam separator 1060 toward a second beam separator, wherein the second beam separator guides the reflected beamlet into another direction and can be focused on a sample.

Figure 10B:
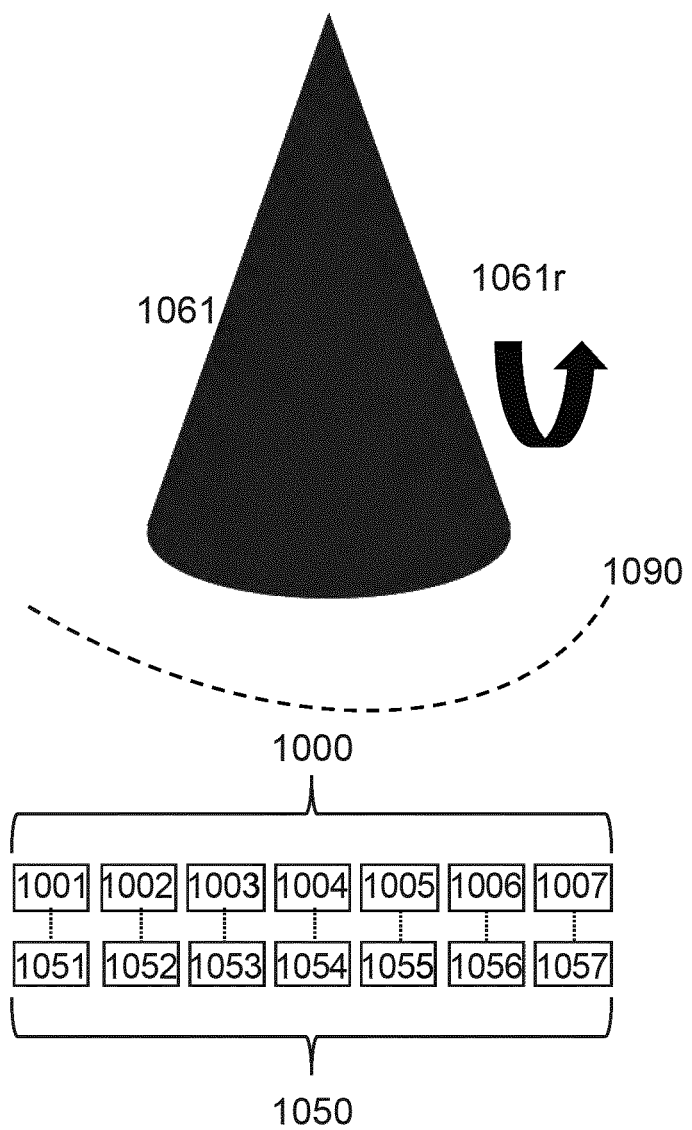
FIG. 10B is a schematic diagram illustrating a functioning of a programmable pixelized mirror plate and a voltage control, consistent with some embodiments of the present disclosure.

Reference is now made to FIG. 10B, which is a schematic diagram illustrating a functioning of a programmable pixelized mirror plate 1000 and a voltage control 1050, consistent with some embodiments of the present disclosure. Mirror plate 1000 may comprise a set of pixels 1001-1007 to shape a profile of a beamlet approaching the set of pixels. Voltage control 1050 may comprise a set of control members 1051-1057 respectively associated with each of the set of pixels 1001-1007. Each pixel control member 1051-1057 is arranged and configured to apply a signal (e.g., voltage) to the associated pixel. Mirror plate 1000 is thus programmable in that the voltages can be provided differently for each pixel or groups of pixels and can be changed as desired. Voltages provided by each of the pixel control member 1051-1057 may generate curved equipotential planes (customized electric fields) 1090 above the mirror plate 1000. The equipotential planes 1090 may determine where electrons from different parts of beamlet 1061 are reflected and the reflection influences a shape and phase of beamlet 1061r reflected by mirror plate 1000. Thus, the adjustment of voltages controls aberrations by adjusting beamlet 1061 locally (i.e., one or more locations where beamlet 1061 is influenced by equipotential planes 1090) and enables the reflected beamlet 1061r to attain a desired characteristic or characteristics, such as focusing at a point on a sample with a desired resolution. While mirror plate 1000 is arranged with seven pixels and corresponding seven control members, it is appreciated that different number of pixels and control members may be arranged, and that the pixels or control members may be arranged in any of various arrangements.

In some embodiments, pixels 1001-1007 and corresponding pixel control members 1051-1057 may each be implemented in separate components. In other embodiments, pixels 1001-1007 and corresponding pixel control members 1051-1057 may be implemented in a single component.

Pixels 1001-1007 may each comprise a rectangular shape. It will be apparent that the pixels may comprise other shapes, such as hexagonal, ring segment, square, another suitable shape, or combinations of these. For example, a beamlet is often rotational symmetric, thus using a pixel shared as a ring segment may provide an advantage of decreasing a number of voltage controls and pixels needed. By way of further example, more pixels can be implemented in the same area by using hexagonal pixels instead of square pixels.

In some embodiments, the sizes of the pixels or shapes of pixels 1001-1007 may vary over the mirror plate 1000. For example, smaller pixels may be used in areas of mirror plate 1000 where more precise correction is needed and can resultingly provide more accuracy in correcting for aberrations. Voltage control 1050 can provide voltages to each of these corresponding smaller pixels to provide for a more accurate beam shape. In some embodiments, each of pixels 1001-1007 can be uniquely controlled. For example, voltage control can provide e.g. negative voltage to some pixels to reflect negatively charged particles interacting with those pixels and can provide positive voltage to other pixels to attract charged particles that may fall outside of the beam shaped preferred for that instance.

In some implementations, mirror plate 1000 may include larger pixels to make the beam shaping easier to control and implement. For example, the larger pixels can each cover a larger area than a smaller pixel and can provide a similar influence (e.g., such as reflection or attraction) on the incoming beamlet. In some implementations, mirror plate 1000 may include larger and smaller pixels, where larger pixels can be used in portions of the mirror plate that are expected to consistently reflect beamlets and smaller pixels in the portions of the mirror plate that may be on the peripherals of where an expected beamlet may interact with in order to give more control to the beam shape In some embodiments, mirror plate 1000 may be curved. When mirror plate 1000 is curved, the voltage used to correct aberrations may be reduced. The mirror curvature may be mechanically adjusted and controlled by mechanical actuators such as piezo motors.

In some embodiments, individual pixels implemented in mirror plate 1000 may be tilted by using the individual pixels with a mechanically tiltable upper surface. The tiltable pixels may be mechanically adjusted and controlled by mechanical actuators such as piezo motors. The tilted pixels may remove charged particles from an incoming beamlet and the removed charged particles can be scattered between mirror plate 1000 and a beam separator. The tilted pixels may create a different path for the charged particles, wherein the different path may can be used to filter the charged particles out of the incoming beamlet with a beam aperture between mirror plate 1000 and a beam separator or elsewhere in the charged particle beam system.

During use, the focused electron beam is scanned across the surface of the sample. During scanning of a focused e-beam over a large field-of-view, the shape and intensity distribution of the image of the source on the surface of the sample, e.g. the spot profile, may change. The use of a programmable mirror plate 1000 provides the ability to correct for or reduce these scanning effects by configuring the programmable mirror plate 1000 dynamically. As set forth above the programmable mirror plate 1000 may be configured as a plate with pixels 1001-1007 with a separate voltage control 1051-1057 for each pixel. Using voltage control 1050 to adjust the voltage at a pixel can change the phase of the electron wave locally, wherein voltage control 1050 may provide AC voltage to pixels to generate a time-dependent beam shape by variably reflecting an incoming beamlet. For example, the portion of the electron wave reflecting above a pixel can enable or facilitate control of the electron spot (probe) formation. As a specific example, synchronizing the mirror plate voltages with the scanning of the e-beam over the sample enables or facilitates dynamic control of probe formation over the entire scanned field-of-view. In another example, more aberrations may appear in an outside edge of a beamlet as compared to the center when scanning a large field of view on a sample. By applying AC voltage to the mirror plate 1000, aberrations in the outside edge of the beamlet can be more precisely corrected.

In some embodiments, mirror plate 1000 may provide using pixel voltage distributions that are different in different directions over the surface of mirror plate 1000. Beam separator 1060 may add aberrations to a beamlet and the aberrations could be non-rotational symmetric because the beamlet is deflecting in one direction. Thus, the beamlet is losing rotational symmetric beam shape and to correct the shape, the mirror plate may use different pixel voltage distributions in two different directions.

Figure 10C:
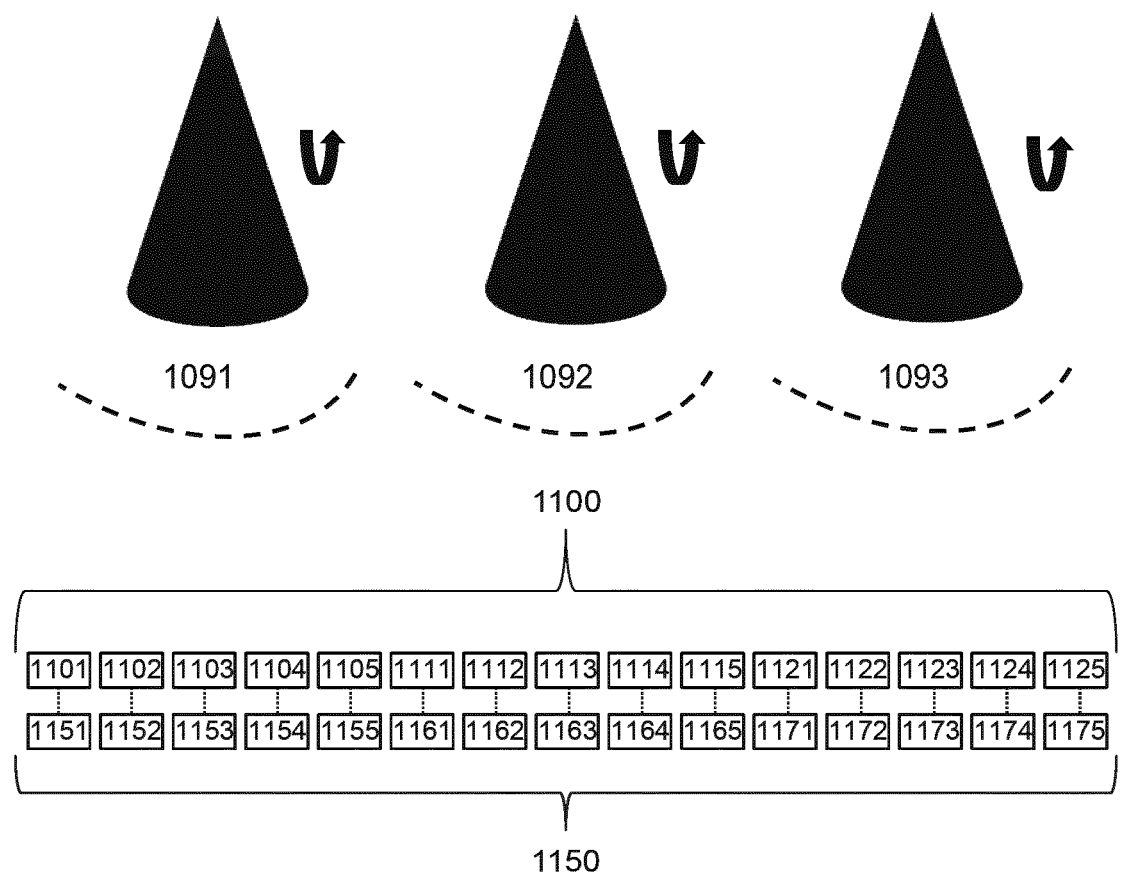
FIG. 10C is another schematic diagram illustrating a functioning of a programmable pixelized mirror plate and a voltage control for correcting different aberrations of different beamlets in a multibeam system, consistent with some embodiments of the present disclosure.

Reference is now made to FIG. 10C, which is another schematic diagram illustrating a functioning of a programmable pixelized mirror plate 1100 and a voltage control 1150 for correcting different aberrations of different beamlets in a multibeam system, consistent with some embodiments of the present disclosure. Mirror plate 1100 may comprise three sets of pixels 1101-1105, 1111-1115, and 1121-1125, and voltage control 1150 may comprise three sets of control members 1151-1155, 1161-1165, and 1171-1175 respectively associated with each of the sets of pixels. Each pixel control member 1151-1155, 1161-1165, and 1171-1175 is arranged and configured to apply a signal (e.g., voltage) to the associated pixel. Voltages provided by each of the pixel control member 1151-1155, 1161-1165, and 1171-1175 may generate corresponding three curved equipotential planes 1091-1093 (customized electric fields) above the mirror plate 1100. The equipotential planes may determine where electrons from different parts of the three beamlets are reflected and the reflection influences a shape and phase of each of the beamlets reflected by mirror plate 1100.

Each set of pixels implemented in mirror plate 1100 may further reflect a beamlet at different heights above the surface of mirror plate 1100 by providing different voltages to each set of pixels. Thus, mirror plate 1100 may influence a shape and phase of each of multiple beamlets and reflect the influenced beamlets toward a beam separator in different angles to enable a SEM to attain a desired characteristic or characteristics, such as focusing at a different point on a sample for each of the beamlets with a desired resolution. Moreover, mirror plate 1100 may locally control the amplitude of the electron waves in addition to or instead of controlling the phase by removing charged particles locally from parts of an incoming beamlet. Mirror plate 1100 may achieve the control of the amplitude by preventing charged particles in the beamlet from being reflected toward a beam separator, for example, by attracting the charged particles to the pixels, instead of reflecting them.

In some embodiments, mirror plate 1100 may remove electrons locally from a beamlet by using a positive voltage on a pixel. The positively charged pixel may attract the electrons above the pixel toward mirror plate 1100 and absorb or scatter the electrons on the surface of mirror plate 1100.

Mirror plate 1100 may also remove positively charged particles in a beamlet by using a negative voltage on a pixel.

Scattered particles or secondary electrons originating from mirror plate 1100 can have a different path between mirror plate 1100 and a beam separator, and can be filtered out by placing a beam aperture at a suitable location between mirror plate 1100 and the beam separator or elsewhere in a charged particle beam system.

The voltage distribution over the pixels may be different for each set of pixels assigned for a particular beamlet or for each mirror plate. In some embodiments, voltage distributions may be the same for certain sets of pixels or mirror plates to limit the number of separate voltage controls needed.

The voltage distributions over the pixels and the overall mirror plate voltage may be adjusted as a function of the landing energy of the beamlets to enable correction or reduction of aberrations at the different e-beam system settings related to different landing energies. The voltage distributions over the pixels may be adjusted as a function of the position of the beamlets on the sample. For example, the position of the beamlet could be a measure of whether or to what extent the beamlet is off-axis from a desired beam spot to optimize correction or reduction of aberrations at various off-axis positions of the beamlets.

The voltage distributions over the pixels and overall mirror plate voltage may be adjusted as a function of the beam current of the beamlets to enable correction or reduction of aberrations at the different e-beam system settings related to different beamlet currents. The voltage distributions over the pixels and the overall mirror plate voltage may be adjusted as a function of the landing angle of the beamlets at the sample to enable correction or reduction of aberrations at the different e-beam system settings related to different landing angles.

The voltage distributions over the pixels and the overall mirror plate voltage may be adjusted as a function of the electrical field at the sample to enable correction or reduction of aberrations at the different e-beam system settings related to different electrical fields at the sample.

While mirror plate 1100 of FIG. 10C is arranged with three sets of pixels and associated three control members to correct aberrations for three beamlets, it is appreciated that different number of sets of pixels, control members, and beamlets may be arranged in any of various arrangements.

Figure 10D:
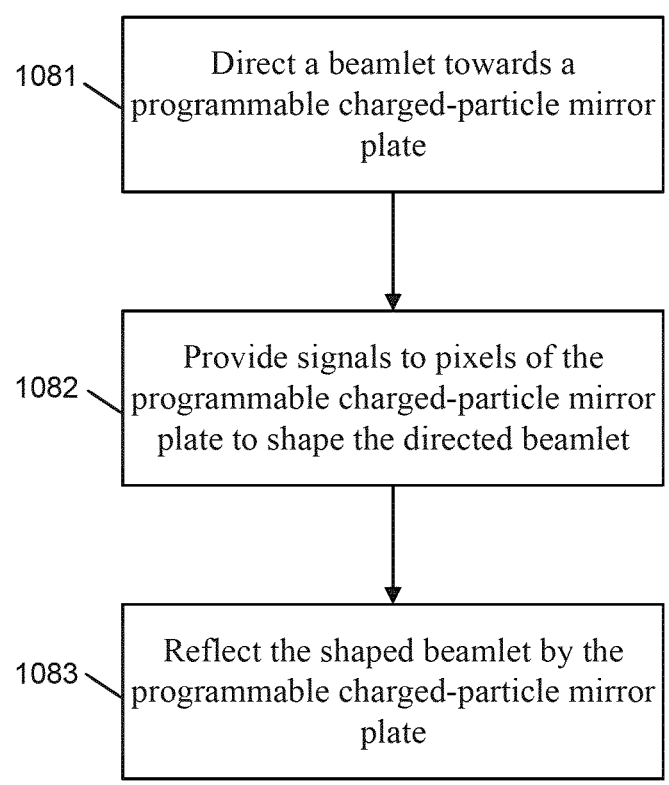
FIG. 10D is a flow chart illustrating an exemplary method of correcting aberrations of a beamlet, consistent with some embodiments of the present disclosure.

Reference is now made to FIG. 10D, which is a flow chart illustrating an exemplary method 1080 of correcting aberrations of a beamlet, consistent with some embodiments of the present disclosure. Method 1080 may be performed by an electron beam tool (e.g., electron beam tool 100B of FIG. 10A). Moreover, while method 1080 describes correcting aberrations for a beamlet, it is appreciated that method 1080 can also apply to correcting aberrations for a plurality of beamlets.

In step 1081, a beamlet is directed towards a programmable charged-particle mirror plate (e.g., programmable charged-particle mirror plate 1000 of FIG. 10A). For example, the beamlet could be directed by a beam separator (e.g., beam separator 1060 of FIG. 10A). In some embodiments, a controller (e.g., controller 19 of FIG. 1) can instruct the beam separator to direct the beamlet to the programmable charged-particle mirror plate.

In step 1082, signals (e.g., voltages) are provided to pixels (e.g., pixels 1001-1007 of FIG. 10B) of the programmable charged-particle mirror plate. In some embodiments, these signals may be provided by a voltage control (e.g., voltage control 1050 of FIG. 10A), wherein each pixel may have a corresponding voltage control (e.g., voltage control 1051-1057 of FIG. 10B). In some embodiments, the provided signals can be negative voltages to reflect electrons (or negative ions) and attract positively charged particles from the beamlet. In some embodiments, the provided signals can be positive voltages to reflect positively charged particles (or positive ions) and attract electrons from the beamlet.

The pixels may include a set of pixels that are used to influence the directed beamlet. For example, the set of pixels can be configured to shape a profile of the beamlet approaching the set of pixels. Each of the set of pixels in the mirror plate can have a separate voltage control that is configured to establish a voltage in the pixel. The mirror plate is thus programmable in that the voltages can be provided differently for each pixel or set of pixels and can be changed as desired. The provided voltage may generate a customized electric field (e.g., equipotential plane 1090 of FIG. 10B), the customized electric field being determined to shape the beamlet profile. Adjustment of the voltage can also change the phase of electrons comprised in the beamlet.

In step 1083, the shaped beamlet is reflected by the programmable charged-particle mirror plate to reduce an aberration. The beamlet is reflected above the surface of mirror plate by a voltage applied to pixels on the mirror plate.

In some embodiments, method 1080 may further include an additional step of directing the shaped beamlet to a sample surface (e.g., sample surface 1012 of FIG. 10A). Prior to reaching the sample surface, the shaped beamlet may be further influenced by an objective lens (e.g., second lens 1031 of FIG. 10A), which can be used to focus the shaped beamlet on to the sample surface.

Figure 11:
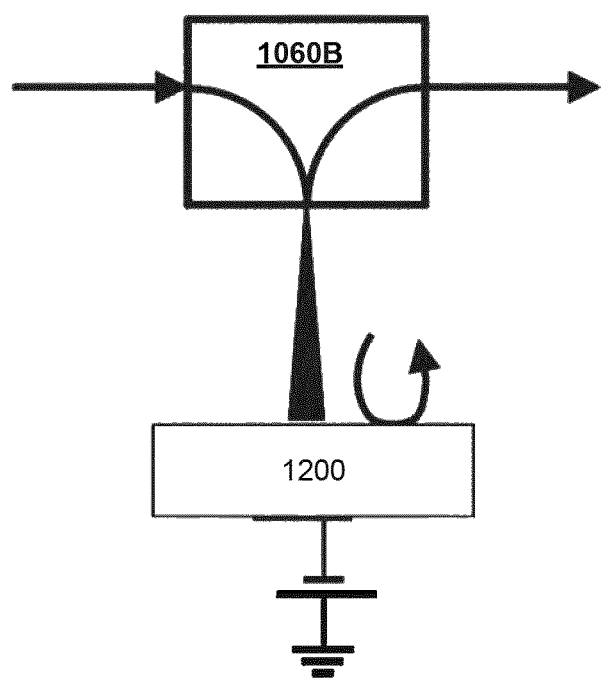
FIG. 11 illustrates an exemplary electron beam tool that may be part of the charged particle inspection system of FIG. 1, consistent with some embodiments of the present disclosure.

FIG. 11 illustrates an exemplary electron beam tool 100C that may be part of the charged particle inspection system of FIG. 1, consistent with some embodiments of the present disclosure. An electron beam tool 100C (also referred to herein as apparatus 100C) comprises a beam separator 1060B and an absorbing component 1200. Other components commonly present such as apertures and deflectors are not shown in FIG. 11 for the purpose of simplicity.

Beam separator 1060B and absorbing component 1200 are introduced into the beam path to reduce the energy spread of charged particle beamlet. It will be understood as described in more detail below that the placement of beam separator 1060B and absorbing component 1200 in apparatus 100C is merely an example, and that beam separator 1060B and absorbing component 1200 may be placed in other positions in the apparatus 100C. Beam separator 1060B can function similar to beam separator 1060 in FIG. 10A and can guide an incoming beamlet towards absorbing component 1200 and further guide a reflected beam from absorbing component 1200 into another direction. Absorbing component 1200 can reduce the energy spread of incoming beamlet and reflect the reduced beamlet toward beam separator 1060B.

Absorbing component 1200 may absorb electromagnetic energy at wavelengths determined by the material of which it is composed and to its geometrical features. When compared with the less energetic electrons of incoming beamlet, highly energetic electrons of incoming beamlet may interact more strongly with electromagnetic modes at a particular frequency and penetrate negative potential more and get closer to absorbing component 1200. The interaction between electrons of incoming beamlet and absorbing component 1200 may get stronger as electrons get closer to absorbing component 1200, and the electrons may lose more energy to electromagnetic radiation towards absorbing component 1200 from the interaction.

Absorbing component 1200 can be configured to be electrically biased to generate negative potential above absorbing component 1200 to reflect an incoming beamlet by connecting a voltage supplier to an outer layer of absorbing component 1200. Of course, this is a simplistic description, and the actual details are set forth more completely and precisely below in FIG. 12B.

Figures 12A, 12B:
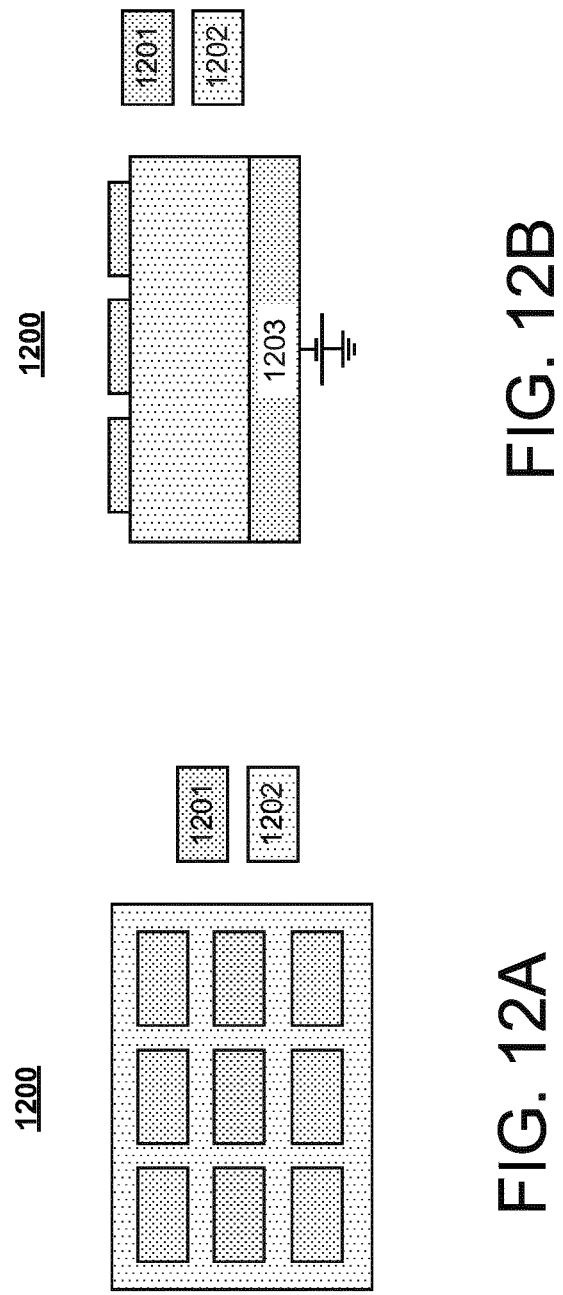
FIG. 12A is a diagrammatic plan view of an absorbing structure of FIG. 11, consistent with some embodiments of the present disclosure.
FIG. 12B is a cross sectional view of the absorbing structure of FIG. 11, consistent with some embodiments of the present disclosure.

FIG. 12A is a diagrammatic plan view of absorbing component 1200. Absorbing component 1200 may comprise a set of absorbing structures 1201 (which can be similar to absorbing structures 314 of FIG. 6) and a layer 1202 (which can be similar to layer 316 of FIG. 6). Absorbing structures 1201 may take any one of a number of forms such as metallic blocks or graphene flakes, among others, or a combination of such materials, embedded in or coupled to layer 1202. By choosing a geometry (shape and dimensions) and altering a pitch between absorbing structures 1201, absorbing component 1200 can be tuned to maximize or optimize the energy loss from electrons depending upon their landing energy and deceleration.

FIG. 12B is a cross sectional view of absorbing component 1200. As described above in respect to FIG. 12A, absorbing component 1200 may comprise a set of absorbing structures 1201, layer 1202, and layer 1203 (which can be similar to layer 318 of FIG. 6). As shown in FIG. 12B, absorbing structures 1201 are provided on layer 1202 comprising, for example, a dielectric material or a transparent conductive material. A transparent conductive material would conduct stray electrons impinging on layer 1202 away from absorbing component 1200 and avoid charging of absorbing component 1200. For example, layer 1202 may be indium-tin-oxide, doped zinc oxide, carbon nanotubes, amorphous material, a doped transparent semiconductor, or a conductive polymer, among others. Layer 1202 may be disposed on layer 1203, which can be an electrically conductive material, such as, for example, gold or silver.

Absorbing component 1200 can be configured to be electrically biased to generate potential above absorbing component 1200 to reflect an incoming beamlet by connecting a voltage supply to layer 1203. Absorbing structures 1201 and layer 1202 may, in certain embodiments, have the same or substantially similar voltage as layer 1203, and create an electric field on top of absorbing component 1200. Putting a sufficiently high negative or positive voltage on absorbing component 1200 may reflect charged particles from a beam traveling towards absorbing component 1200.

Absorbing component 1200 can include structures and layers (e.g., structures 1201 and layers 1202 and 1203) that provide functionalities similar to the functionalities of structures and layers (e.g., structures 314 and layers 316 and 318) shown in FIGS. 6-8, so that absorbing component 1200 can absorb energy of the charged particles that have energy above a certain threshold.

In some embodiments, absorbing component 1200 can include other types of layers, such as multiple metal and dielectric layers.

Figure 13:
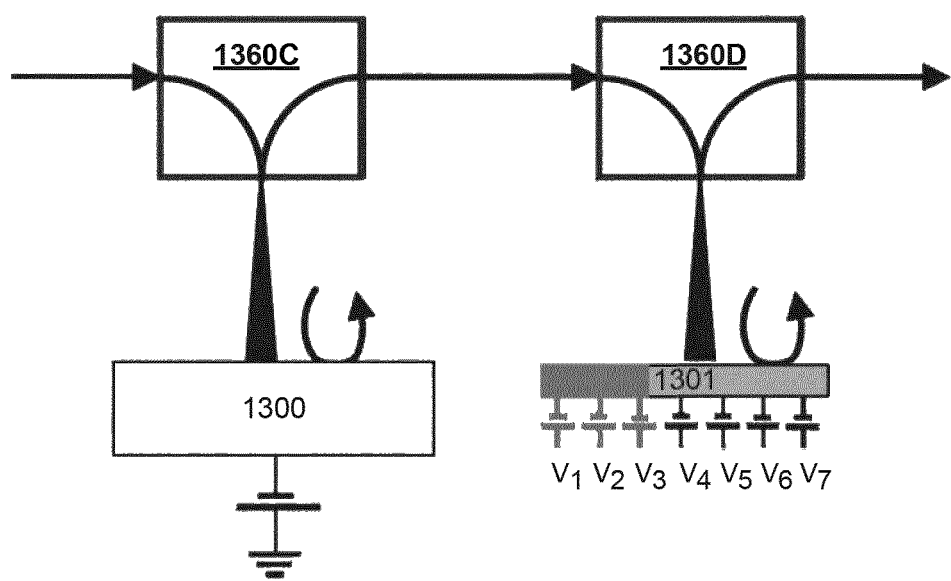
FIG. 13 is a schematic diagram illustrating a functioning of a cascade construction of an absorbing structure and a programmable pixelized mirror plate, consistent with some embodiments of the present disclosure.

FIG. 13 is a schematic diagram illustrating a functioning of a cascade construction of an absorbing component 1300 and a programmable pixelized mirror plate 1301, consistent with some embodiments of the present disclosure. The cascade construction can be implemented in an electron beam tool 100D (also referred to herein as apparatus 100D). The cascade construction may comprise a first beam separator 1360C, a second beam separator 1360D, absorbing component 1300, and mirror plate 1301. First beam separator 1360C can function similar to beam separator 1060 in FIG. 10A, and can guide an incoming beamlet towards absorbing component 1300 and further guide a reflected beam from absorbing component 1300 into another direction. In some embodiments, first beam separator 1360C may guide an incoming beamlet to fall perpendicular to absorbing component 1300. Absorbing component 1300 can function similar to absorbing component 1200 in FIG. 11 and can manipulate incoming beamlet 102 by reducing the energy spread in incoming beamlet and reflect the manipulated beamlet. Second beam separator 1360D can also function similar to beam separator 1060 in FIG. 10A and can guide an incoming beamlet towards mirror plate 1301 and further guide a reflected beam from mirror plate 1301 into another direction.

Mirror plate 1301 can function similar to mirror plate 1000 in FIGS. 10A-C and correct aberrations of an incoming beamlet, wherein the aberrations may have been introduced by absorbing component 1300. Mirror plate 1301 may further reflect the corrected beamlet. Thus, the cascade construction may ensure that both the aberrations and the energy spread are corrected.

While the cascade construction of FIG. 13 is arranged such that a beamlet propagates through absorbing component 1300 and then mirror plate 1301, it is appreciated that mirror plates and absorbing structures may be arranged in any of various arrangements (such as mirror plate 1301 preceding absorbing component 1300).

Figure 14:
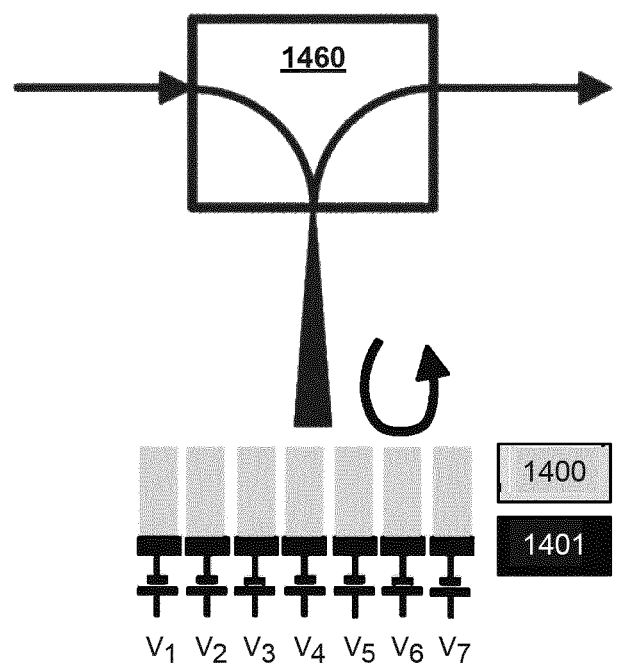
FIG. 14 is a schematic diagram illustrating a functioning of a combined construction of an absorbing structure and a programmable pixelized mirror plate, consistent with some embodiments of the present disclosure.

FIG. 14 is a schematic diagram illustrating a functioning of a combined construction of a set of absorbing components 1400 and a programmable pixelized mirror plate 1401, consistent with some embodiments of the present disclosure. The combined construction can be implemented in an electron beam tool 100E (also referred to herein as apparatus 100E). The combined construction may comprise a beam separator 1460, a set of absorbing components 1400, and mirror plate 1401. Beam separator 1460 can function similar to beam separator 1060 in FIG. 10A, and can guide an incoming beamlet towards a combined structure comprising a set of absorbing components 1400 and mirror plate 1401 and further guide a reflected beam from the combined structure into another direction.

One or more absorbing components 1400 can be embedded in or coupled to the top of mirror plate 1401. For example, there may be a different absorbing component 1400 for each pixel of mirror plate 1401, an absorbing component 1400 for a set of pixels, or an absorbing component 1400 for all pixels of mirror plate. In some embodiments, different absorbing components can be implemented on each pixel of mirror plate 1401. Mirror plate 1401 may replace a layer of absorbing component 1400 (such as layer 1202 in FIG. 12B) or an outer layer of absorbing component 1400 (such as layer 1203 in FIG. 12B). Absorbing component 1400 can function similar to absorbing component 1200 in FIGS. 11 and 12A-B and can manipulate incoming beamlet by reducing the energy spread in incoming beamlet. Mirror plate 1401 can function similar to mirror plate 1000 in FIG. 10A and correct aberrations of an incoming beamlet and reflect the corrected beamlet. Absorbing component 1400 and mirror plate 1401 can operate simultaneously to ensure that both the aberrations and the energy spread are corrected. The electric field generated by mirror plate 1401 may repel charged particles of the incoming beamlet to correct for the aberrations while the charged particles pass sufficiently close to absorbing component 1400 before reflected by mirror plate 1401 that absorbing component may absorb the desired energy, with the result that substantially all the reflected charged particles have a similar energy.

Figure 15:
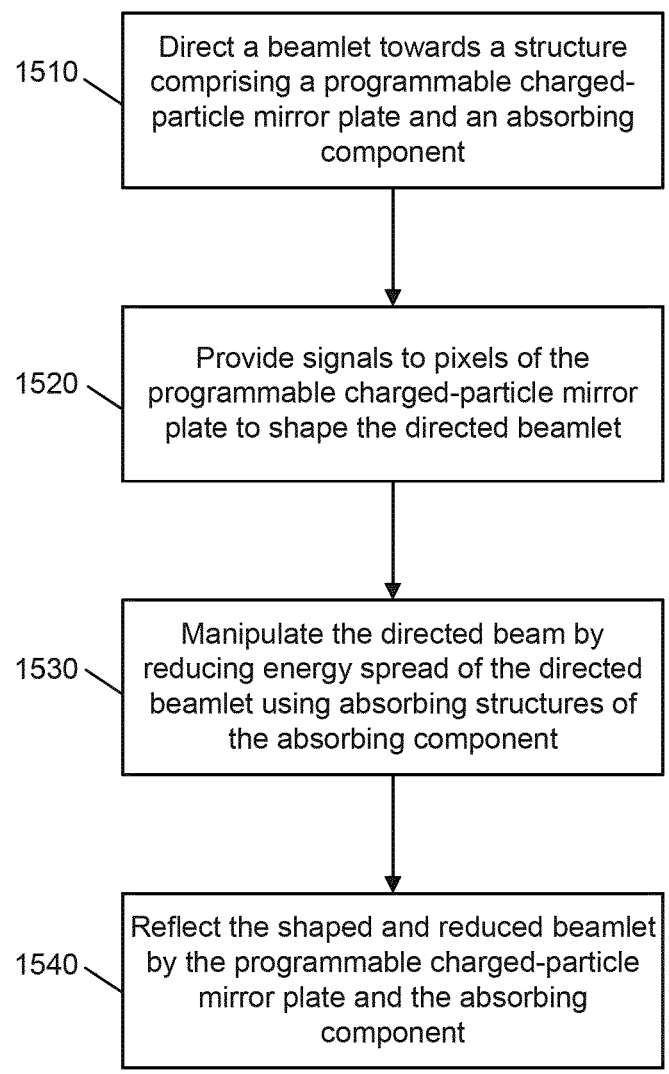
FIG. 15 is a flow chart illustrating an exemplary method of correcting aberrations and energy spread of a beamlet, consistent with some embodiments of the present disclosure.

Reference is now made to FIG. 15, which is a flow chart illustrating an exemplary method 1500 of correcting aberrations and an energy spread of a beamlet, consistent with some embodiments of the present disclosure. Method 1500 may be performed by an electron beam tool (e.g., electron beam tool 100E of FIG. 14). Moreover, while method 1500 describes correcting aberrations and an energy spread for a beamlet, it is appreciated that method 1500 can also apply to correcting aberrations and an energy spread for a plurality of beamlets.

In step 1510, a beamlet is directed towards a combined structure comprising an absorbing component (e.g., absorbing component 1400 of FIG. 14) and a programmable charged-particle mirror plate (e.g., programmable charged-particle mirror plate 1401 of FIG. 14). For example, the beamlet could be directed by a beam separator (e.g., beam separator 1460 of FIG. 14). While the embodiment of FIG. 15 uses a programmable mirror plate, it is appreciated that other types of mirror plates may be used. In some embodiments, a controller (e.g., controller 19 of FIG. 1) can instruct the beam separator to direct the beamlet to the combined structure.

In step 1520, signals (e.g., voltages) are provided to pixels (e.g., pixels 1001-1007 of FIG. 10B) of the programmable charged-particle mirror plate. In some embodiments, these signals may be provided by a voltage control (e.g., voltage control 1050 of FIG. 10A), wherein each pixel may have a corresponding voltage control (e.g., voltage control 1051-1057 of FIG. 10B). In some embodiments, the provided signals can be negative voltages to reflect electrons (or negative ions) and attract positively charged particles from the beamlet (if present). In some embodiments, the provided signals can be positive voltages to reflect positively charged particles (or positive ions) and attract electrons from the beamlet (if present).

The pixels may include a set of pixels that are used to influence the directed beamlet. For example, the set of pixels can be configured to shape a profile of the beamlet approaching the set of pixels. Each of the set of pixels in the mirror plate can have a separate voltage control that is configured to establish a voltage in the pixel. The mirror plate is thus programmable in that the voltages can be provided differently for each pixel or set of pixels and can be changed as desired. The provided voltage may generate a customized electric field (e.g., equipotential plane 1090 of FIG. 10B), the customized electric field being determined to shape the beamlet profile. Adjustment of the voltage can also change the phase of electrons comprised in the beamlet.

In step 1530, absorbing component (e.g., absorbing component 1400 of FIG. 14) may manipulate the directed beam from the beam separator by reducing the energy spread of the directed beam using absorbing structures (e.g., absorbing structures 1201 in FIGS. 12A and 12B).

The absorbing component may absorb electromagnetic energy at wavelengths determined by the material of which it is composed and to its geometrical features. Highly energetic electrons of incoming beamlet may interact strongly with electromagnetic modes at a particular frequency than the less energetic electrons of incoming beamlet. The strong interaction may enable the electrons to penetrate negative potential more and get closer to the absorbing component. The interaction between electrons of an incoming beamlet and the absorbing component may get stronger as electrons get closer to the absorbing component, and the electrons may lose more energy to electromagnetic radiation towards the absorbing component from the interaction.

In step 1540, the shaped and manipulated beamlet is reflected by the programmable charged-particle mirror plate and the absorbing component to reduce aberrations and an energy spread. The beamlet is reflected above the surface of mirror plate by a voltage applied to pixels on the mirror plate.

In some embodiments, method 1500 may further include an additional step of directing the shaped and manipulated beamlet to a sample surface (e.g., sample surface 1012 of FIG. 10A). Prior to reaching the sample surface, the shaped and manipulated beamlet may be further influenced by an objective lens (e.g., second lens 1031 of FIG. 10A), which can be used to focus the shaped and manipulated beamlet on to the sample surface.

Figure 16:
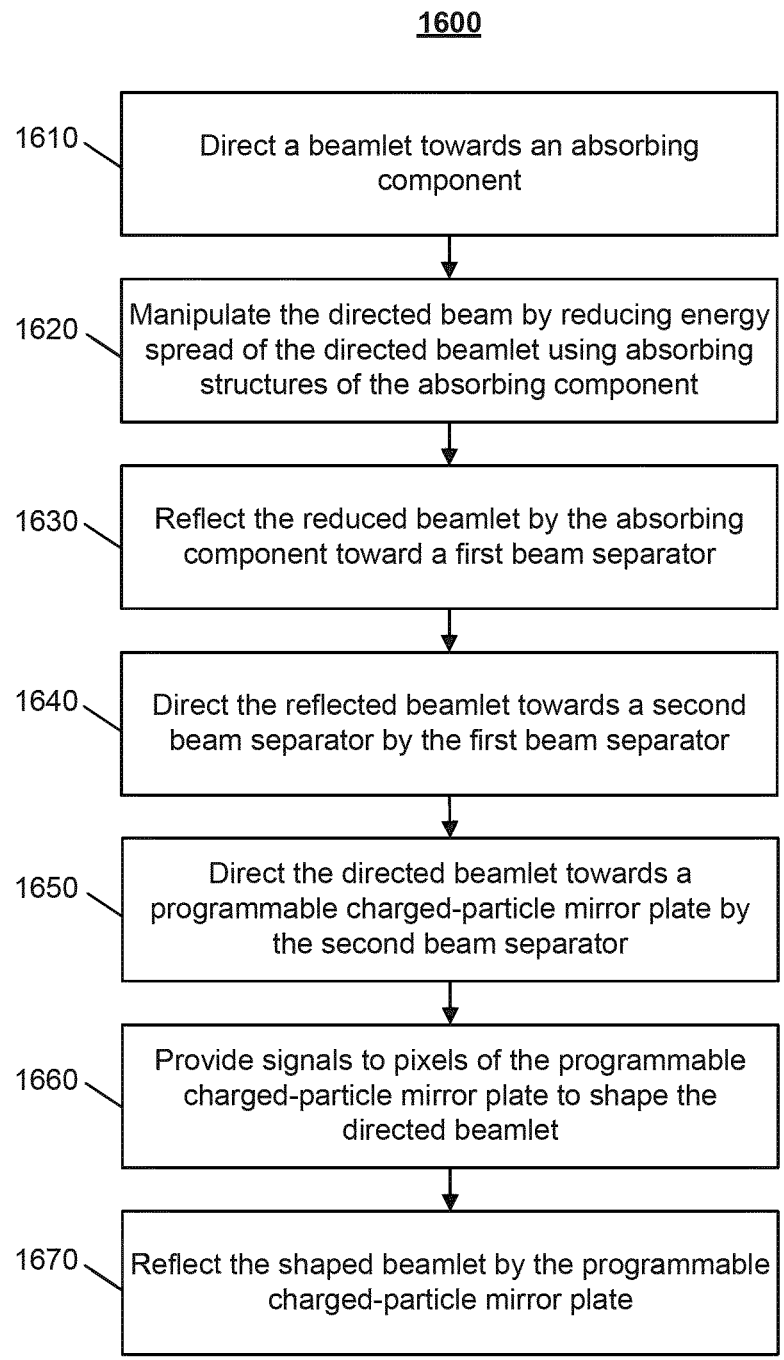
FIG. 16 is a flow chart illustrating another exemplary method of correcting aberrations and energy spread of a beamlet, consistent with some embodiments of the present disclosure.

Reference is now made to FIG. 16, which is a flow chart illustrating another exemplary method 1600 of correcting aberrations and energy spread of a beamlet, consistent with some embodiments of the present disclosure. Method 1600 may be performed by an electron beam tool (e.g., electron beam tool 100D of FIG. 13). Moreover, while method 1600 describes correcting aberrations and energy spread for a beamlet, it is appreciated that method 1600 can also apply to correcting aberrations and energy spread for a plurality of beamlets.

In step 1610, a beamlet is directed towards an absorbing component (e.g., absorbing component 1300 of FIG. 13). For example, the beamlet could be directed by a first beam separator (e.g., beam separator 1360C of FIG. 13). In some embodiments, a controller (e.g., controller 19 of FIG. 1) can instruct the first beam separator to direct the beamlet to the absorbing component.

In step 1620, the absorbing component may manipulate the directed beam from the first beam separator by reducing energy spread of the directed beam using absorbing structures (e.g., absorbing structures 1201 in FIGS. 12A and 12B).

The absorbing component may absorb electromagnetic energy at wavelengths determined by the material of which it is composed and to its geometrical features. Highly energetic electrons of incoming beamlet may interact strongly with electromagnetic modes at a particular frequency than the less energetic electrons of incoming beamlet. The strong interaction may enable the electrons to penetrate negative potential more and get closer to the absorbing component. The interaction between electrons of incoming beamlet and the absorbing component may get stronger as electrons get closer to the absorbing component, and the electrons lose more energy to electromagnetic radiation towards the absorbing component from the interaction.

In step 1630, the manipulated beamlet is reflected by the absorbing component to a first beam separator. The absorbing component can be configured to be electrically biased to generate negative or positive potential above the absorbing component to reflect the directed beamlet.

In step 1640, the reflected beamlet from step 1630 is directed towards a second beam separator (e.g., beam separator 1360D of FIG. 13) by the first beam separator. In some embodiments, a controller (e.g., controller 19 of FIG. 1) can instruct the first beam separator to direct the beamlet to the second beam separator. While the embodiments describe using the beam separator, it is appreciated that another optical element can be used to direct the beamlet.

In step 1650, the directed beamlet from step 1640 is directed towards a programmable charged-particle mirror plate (e.g., programmable charged-particle mirror plate 1301 of FIG. 13). For example, the beamlet could be directed by a second beam separator (e.g., beam separator 1360D of FIG. 13). While the embodiment of FIG. 16 uses a programmable mirror plate, it is appreciated that other types of mirror plates may be used. In some embodiments, a controller (e.g., controller 19 of FIG. 1) can instruct the second beam separator to direct the beamlet to the mirror plate.

In step 1660, signals (e.g., voltages) are provided to pixels (e.g., pixels 1001-1007 of FIG. 10B) of the programmable charged-particle mirror plate. In some embodiments, these signals may be provided by a voltage control (e.g., voltage control 1050 of FIG. 10A), wherein each pixel may have a corresponding voltage control (e.g., voltage control 1051-1057 of FIG. 10B). In some embodiments, the provided signals can be negative voltages to reflect electrons (or negative ions) and attract positively charged particles from the beamlet. In some embodiments, the provided signals can be positive voltages to reflect positively charged particles (or positive ions) and attract electrons from the beamlet.

The pixels may include a set of pixels that are used to influence the directed beamlet that may have been distorted by the absorbing structure. For example, the set of pixels can be configured to shape a profile of the beamlet approaching the set of pixels. Each of the set of pixels in the mirror plate can have a separate voltage control that is configured to establish a voltage in the pixel. The mirror plate is thus programmable in that the voltages can be provided differently for each pixel or set of pixels and can be changed as desired. The provided voltage may generate a customized electric field (e.g., equipotential plane 1090 of FIG. 10B), the customized electric field being determined to shape the beamlet profile. Adjustment of the voltage can also change the phase of electrons comprised in the beamlet.

In step 1670, the shaped beamlet is reflected by the programmable charged-particle mirror plate to reduce aberrations. The beamlet is reflected above the surface of mirror plate by a voltage applied to pixels on the mirror plate.

In some embodiments, method 1600 may further include an additional step of directing the shaped and manipulated beamlet to a sample surface (e.g., sample surface 1012 of FIG. 10A). Prior to reaching the sample surface, the shaped and manipulated beamlet may be further influenced by an objective lens (e.g., second lens 1031 of FIG. 10A), which can be used to focus the shaped and manipulated beamlet on to the sample surface.

In some embodiments, a controller may control a charged particle beam system. The controller may include a computer processor. The controller may instruct components of the charged particle beam system to perform various functions, such as controlling the various drivers for manipulating one or more beamlets, for controlling a beam separator for directing beamlets and for controlling voltage control and corresponding pixels of the programmable charged-particle mirror plate. The controller may comprise a storage that is a storage medium such as a hard disk, cloud storage, random access memory (RAM), other types of computer readable memory, and the like. The controller may communicate with a cloud storage. A non-transitory computer readable medium may be provided that stores instructions for a processor of controller 19 to carry out beam forming, or other functions and methods consistent with the present disclosure. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

The embodiments may further be described using the following clauses:

1. An apparatus for narrowing an energy spread of an electron beam, the apparatus comprising:
   structure defining a cavity extending along a part of a path of the electron beam, the cavity having an interior surface; and
   a metamaterial absorber provided on the interior surface.

2. An apparatus as recited in clause 1 wherein the metamaterial absorber comprises a layer of a dielectric material on at least part of the interior surface wherein the layer of a transparent conductive material is provided with a plurality of absorbing structures.

3. An apparatus as recited in clause 1 wherein the metamaterial absorber comprises a layer of a transparent conductive material on at least part of the interior surface wherein the layer of a transparent conductive material is provided with a plurality of absorbing structures.

4. An apparatus as recited in clause 3 wherein the absorbing structures are metamaterial perfect absorbers.

5. An apparatus as recited in clause 3 wherein the absorbing structures are plasmonic structures.

6. An apparatus as recited in clause 3 wherein the absorbing structures resonantly absorb electromagnetic energy.

7. An apparatus as recited in clause 3 wherein the absorbing structures are at least partially embedded in or coupled to the layer of transparent conductive material.

8. An apparatus as recited in clause 3 wherein the absorbing structures are fabricated on top of the layer of transparent conductive material.

9. An apparatus as recited in clause 3 wherein the absorbing structures are printed on the layer of transparent conductive material.

10. An apparatus as recited in clause 3 wherein the absorbing structures comprise a plurality of block-shaped elements comprising a metallic material.

11. An apparatus as recited in clause 3 wherein the absorbing structures comprise graphene.

12. An apparatus as recited in clause 3 wherein the absorbing structures comprise a plurality of graphene flakes.

13. An apparatus as recited in clause 3 wherein the absorbing structures comprise a combination of a plurality of block-shaped metallic elements and a plurality of graphene flakes.

14. An apparatus as recited in clause 3 wherein the absorbing structures are arranged in a periodic array.

15. An apparatus as recited in clause 14 wherein a pitch of the periodic array is selected to achieve maximum absorption of energy from the electron beam.

16. An apparatus as recited in clause 3 wherein the transparent conductive material comprises indium-tin-oxide.

17. An apparatus as recited in clause 3 wherein the transparent conductive material comprises doped zinc oxide.

18. An apparatus as recited in clause 3 wherein the transparent conductive material comprises carbon nanotubes.

19. An apparatus for as recited in clause 3 wherein the transparent conductive material comprises an amorphous material.

20. An apparatus as recited in clause 3 wherein the transparent conductive material comprises a doped transparent semiconductor.

21. An apparatus as recited in clause 3 wherein the transparent conductive material comprises a conductive polymer.

22. An apparatus as recited in clause 3 wherein the transparent conductive material comprises a body comprising a transparent material and coating of a conductive material.

23. An apparatus as recited in clause 22 wherein the coating of a conductive material comprises gold.

24. An apparatus as recited in clause 22 wherein the coating of a conductive material comprises aluminum.

25. An apparatus as recited in clause 22 wherein the coating of a conductive material comprises titanium.

26. An apparatus as recited in clause 22 wherein the coating of a conductive material comprises chromium.

27. An apparatus as recited in clause 1 wherein the structure comprises a substantially cylindrical column.

28. An apparatus as recited in clause 27 wherein a length of a part of the column traversed by the electron beam is chosen to cause a predetermined amount of deceleration of electrons in the electron beam.

29. An apparatus as recited in clause 27 wherein the substantially cylindrical column comprises an electrically conductive material.

30. An apparatus as recited in clause 29 wherein the electrically conductive material comprises gold.

31. An apparatus as recited in clause 29 wherein the electrically conductive material comprises silver.

32. An apparatus as recited in clause 28 wherein the electron beam propagates along a central axis of the column.

33. An apparatus as recited in clause 28 wherein the radius of the substantially cylindrical column decreases in a direction the electron beam propagates.

34. An apparatus as recited in clause 3 wherein dimensions of the absorbing structures vary in a direction in which the electron beam propagates.

35. An apparatus for generating a substantially monochromatic electron beam, the apparatus comprising:
- a source of an electron beam;
- a monochromator comprising a metamaterial absorber arranged to interact with the electron beam to produce a substantially monochromatic electron beam; and
- an objective lens arranged to focus the substantially monochromatic electron beam.

36. An apparatus as recited in clause 35 wherein the monochromator comprises a structure defining a cavity having an interior surface and a metamaterial absorber provided on the interior surface.

37. An apparatus as recited in clause 36 wherein the metamaterial absorber comprises a layer of a transparent conductive material on at least part of the interior surface wherein the layer of a transparent conductive material is provided with a plurality of absorbing structures.

38. An apparatus as recited in clause 37 wherein the absorbing structures are metamaterial perfect absorbers.

39. An apparatus as recited in clause 37 wherein the absorbing structures comprise plasmonic absorbers.

40. An apparatus as recited in clause 37 wherein the absorbing structures resonantly absorb electromagnetic energy.

41. An apparatus as recited in clause 37 wherein the absorbing structures are at least partially embedded in or coupled to the layer of transparent conductive material.

42. An apparatus as recited in clause 37 wherein the absorbing structures are fabricated on top of the layer of transparent conductive material.

43. An apparatus as recited in clause 37 wherein the absorbing structures are printed on the layer of transparent conductive material.

44. An apparatus as recited in clause 37 wherein the absorbing structures comprise a plurality of block-shaped elements comprising a metallic material.

45. An apparatus as recited in clause 37 wherein the absorbing structures comprise graphene.

46. An apparatus as recited in clause 37 wherein the absorbing structures comprise a plurality of graphene flakes.

47. An apparatus as recited in clause 37 wherein the absorbing structures comprise a combination of a plurality of block-shaped metallic elements and a plurality of graphene flakes.

48. An apparatus as recited in clause 37 wherein the absorbing structures are arranged in a periodic array.

49. An apparatus as recited in clause 48 wherein a pitch of the periodic array is selected to achieve maximum absorption of energy from the electron beam.

50. An apparatus as recited in clause 37 wherein the transparent conductive material comprises indium-tin-oxide.

51. An apparatus as recited in clause 37 wherein the transparent conductive material comprises doped zinc oxide.

52. An apparatus as recited in clause 37 wherein the transparent conductive material comprises carbon nanotubes.

53. An apparatus as recited in clause 37 wherein the transparent conductive material comprises an amorphous material.

54. An apparatus as recited in clause 37 wherein the transparent conductive material comprises a doped transparent semiconductor.

55. An apparatus as recited in clause 37 wherein the transparent conductive material comprises a conductive polymer.

56. An apparatus as recited in clause 37 wherein the transparent conductive material comprises a body comprising a transparent material and coating of a conductive material.

57. An apparatus as recited in clause 56 wherein the coating of a conductive material comprises gold.

58. An apparatus as recited in clause 56 wherein the coating of a conductive material comprises aluminum.

59. An apparatus as recited in clause 56 wherein the coating of a conductive material comprises titanium.

60. An apparatus as recited in clause 56 wherein the coating of a conductive material comprises chromium.

61. An apparatus as recited in clause 36 wherein the structure comprises a column comprising an electrically conductive material.

62. An apparatus as recited in clause 61 wherein the electrically conductive material comprises gold.

63. An apparatus as recited in clause 61 wherein the electrically conductive material comprises silver.

64. An apparatus as recited in clause 61 wherein the column is substantially cylindrical.

65. An apparatus as recited in clause 61 wherein a length of part of the column traversed by the electron beam is chosen to cause a predetermined amount of deceleration of electrons in the electron beam.

66. An apparatus as recited in clause 64 wherein the electron beam propagates along a central axis of the column.

67. An apparatus as recited in clause 66 wherein the radius of the column decreases in a direction the electron beam propagates.

68. An apparatus as recited in clause 36 wherein geometric properties of the absorbing structures vary in a direction in which the electron beam propagates.

69. An apparatus for generating a substantially monochromatic electron beam, the apparatus comprising:
   a first aperture arranged to obstruct part of the electron beam to produce a modified electron beam;
   at least one electromagnetic condenser lens arranged to collimate the modified electron beam to produce a collimated electron beam;
   a second aperture arranged to obstruct part of the collimated electron beam to produce a modified collimated electron beam;
   a passive monochromator comprising a metamaterial absorber arranged to interact with the modified collimated electron beam to narrow an energy spread of the electron beam; and
   an objective lens arranged to focus the electron beam from the passive monochromator.

70. An apparatus as recited in clause 69 wherein the passive monochromator comprises a structure defining a cavity having an interior surface and a metamaterial absorber provided on the interior surface.

71. An apparatus as recited in clause 70 wherein the metamaterial absorber comprises a layer of a transparent conductive material on at least part of the interior surface wherein the layer of a transparent conductive material is provided with absorbing structures.

72. An apparatus as recited in clause 71 wherein the absorbing structures comprise plasmonic absorbers.

73. An apparatus as recited in clause 71 wherein the absorbing structures resonantly absorb electromagnetic energy.

74. An apparatus as recited in clause 71 wherein the absorbing structures are at least partially embedded in or coupled to the layer of transparent conductive material.

75. An apparatus as recited in clause 71 wherein the absorbing structures are fabricated on top of the layer of transparent conductive material.

76. An apparatus as recited in clause 71 wherein the absorbing structures are printed on the layer of transparent conductive material.

77. An apparatus as recited in clause 71 wherein the absorbing structures comprise a plurality of block-shaped elements comprising a metallic material.

78. An apparatus as recited in clause 71 wherein the absorbing structures comprise graphene.

79. An apparatus as recited in clause 71 wherein the absorbing structures comprise a plurality of graphene flakes.

80. An apparatus as recited in clause 71 wherein the absorbing structures comprise a combination of a plurality of block-shaped metallic elements and a plurality of graphene flakes.

81. An apparatus as recited in clause 71 wherein the absorbing structures are arranged in a periodic array.

82. An apparatus as recited in clause 81 wherein a pitch of the periodic array is selected to achieve maximum absorption of energy from the electron beam.

83. An apparatus as recited in clause 71 wherein the transparent conductive material comprises indium-tin-oxide.

84. An apparatus as recited in clause 71 wherein the transparent conductive material comprises doped zinc oxide.

85. An apparatus as recited in clause 71 wherein the transparent conductive material comprises carbon nanotubes.

86. An apparatus as recited in clause 71 wherein the transparent conductive material an amorphous material.

87. An apparatus as recited in clause 71 wherein the transparent conductive material comprises a doped transparent semiconductor.

88. An apparatus as recited in clause 71 wherein the transparent conductive material comprises a conductive polymer.

89. An apparatus as recited in clause 71 wherein the transparent conductive material comprises a body comprising a transparent material and coating of a conductive material.

90. An apparatus as recited in clause 89 wherein the coating of a conductive material comprises gold.

91. An apparatus as recited in clause 89 wherein the coating of a conductive material comprises aluminum.

92. An apparatus as recited in clause 89 wherein the coating of a conductive material comprises titanium.

93. An apparatus as recited in clause 89 wherein the coating of a conductive material comprises chromium.

94. An apparatus as recited in clause 70 wherein the structure comprises a column comprising an electrically conductive material.

95. An apparatus as recited in clause 94 wherein the electrically conductive material comprises gold.

96. An apparatus as recited in clause 94 wherein the electrically conductive material comprises silver.

97. An apparatus as recited in clause 94 wherein the column is substantially cylindrical.

98. An apparatus as recited in clause 94 wherein the electron beam propagates along a central axis of the column.

99. An apparatus as recited in clause 94 wherein the radius of the column decreases in a direction the electron beam propagates.

100. An apparatus as recited in clause 94 wherein a length of the part of the column traversed by the electron beam is chosen to cause a predetermined amount of deceleration of electrons in the electron beam.

101. An apparatus as recited in clause 71 wherein geometric properties of the absorbing structures vary in a direction in which the electron beam propagates.

102. An apparatus for narrowing an energy spread of an electron beam, the apparatus comprising:
   structure defining a cavity extending along a part of a path of the electron beam, the cavity having an interior surface, the interior surface being adapted to absorb energy from electrons in the electron beam to narrow an energy spread of the electron beam.

103. An apparatus as recited in clause 102 wherein the interior surface comprises a metamaterial absorber.

104. An apparatus as recited in clause 103 wherein the metamaterial absorber comprises a layer of a transparent conductive material on at least part of the interior surface wherein the layer of a transparent conductive material is provided with absorbing structures.

105. An apparatus as recited in clause 104 wherein the absorbing structures comprise plasmonic absorbers.

106. An apparatus as recited in clause 104 wherein the absorbing structures resonantly absorb electromagnetic energy.

107. An apparatus as recited in clause 104 wherein the absorbing structures are at least partially embedded in or coupled to the layer of transparent conductive material.

108. An apparatus as recited in clause 104 wherein the absorbing structures are fabricated on top of the layer of transparent conductive material.

109. An apparatus as recited in clause 104 wherein the absorbing structures are printed on the layer of transparent conductive material.

110. An apparatus as recited in clause 104 wherein the absorbing structures comprise a plurality of block-shaped elements comprising a metallic material.

111. An apparatus as recited in clause 104 wherein the absorbing structures comprise graphene.

112. An apparatus as recited in clause 104 wherein the absorbing structures comprise a plurality of graphene flakes.

113. An apparatus as recited in clause 104 wherein the absorbing structures comprise a combination of a plurality of block-shaped metallic elements and a plurality of graphene flakes.

114. An apparatus as recited in clause 104 wherein the absorbing structures are arranged in a periodic array.

115. An apparatus as recited in clause 114 wherein a pitch of the periodic array is selected to achieve maximum absorption of energy from the electron beam.

116. An apparatus as recited in clause 104 wherein the transparent conductive material comprises indium-tin-oxide.

117. An apparatus as recited in clause 104 wherein the transparent conductive material comprises doped zinc oxide.

118. An apparatus as recited in clause 104 wherein the transparent conductive material comprises carbon nanotubes.

119. An apparatus as recited in clause 104 wherein the transparent conductive material comprises an amorphous material.

120. An apparatus as recited in clause 104 wherein the transparent conductive material comprises a doped transparent semiconductor.

121. An apparatus as recited in clause 104 wherein the transparent conductive material comprises a conductive polymer.

122. An apparatus as recited in clause 104 wherein the transparent conductive material comprises a body comprising a transparent material and coating of a conductive material.

123. An apparatus as recited in clause 122 wherein the coating of a conductive material comprises gold.

124. An apparatus as recited in clause 122 wherein the coating of a conductive material comprises aluminum.

125. An apparatus as recited in clause 122 wherein the coating of a conductive material comprises titanium.

126. An apparatus as recited in clause 122 wherein the coating of a conductive material comprises chromium.

127. An apparatus as recited in clause 102 wherein the structure comprises a column comprising an electrically conductive material.

128. An apparatus as recited in clause 127 wherein the electrically conductive material comprises gold.

129. An apparatus as recited in clause 127 wherein the electrically conductive material comprises silver.

130. An apparatus as recited in clause 127 wherein the column is substantially cylindrical.

131. An apparatus as recited in clause 130 wherein the electron beam propagates along a central axis of the column.

132. An apparatus as recited in clause 130 wherein the radius of the column decreases in a direction the electron beam propagates.

133. An apparatus as recited in clause 130 wherein a length of the part of the column traversed by the electron beam is chosen to cause a predetermined amount of deceleration of electrons in the electron beam.

134. An apparatus as recited in clause 104 wherein geometric properties of the absorbing structures vary in a direction in which the electron beam propagates.

135. A method of reducing a width of an energy distribution in a beam of electrons, the method comprising the step of passing the beam through a volume of space defined by a structure extending along a path of the beam, the structure having a surface provided with a metamaterial absorber arranged to absorb energy from the electrons.

136. A method as recited in clause 135 wherein the metamaterial absorber comprises a layer of a transparent conductive material on at least part of the surface wherein the layer of a transparent conductive material is provided with a plurality of absorbing structures.

137. A method as recited in clause 136 wherein the absorbing structures are metamaterial perfect absorbers.

138. A method as recited in clause 136 wherein the absorbing structures are plasmonic structures.

139. A method as recited in clause 136 wherein the absorbing structures resonantly absorb electromagnetic energy.

140. A method as recited in clause 136 wherein the absorbing structures are at least partially embedded in or coupled to the layer of transparent conductive material.

141. A method as recited in clause 136 wherein the absorbing structures are fabricated on top of the layer of transparent conductive material.

142. A method as recited in clause 136 wherein the absorbing structures are printed on the layer of transparent conductive material.

143. A method as recited in clause 136 wherein the absorbing structures comprise a plurality of block-shaped elements comprising a metallic material.

144. A method as recited in clause 136 wherein the absorbing structures comprise graphene.

145. A method as recited in clause 136 wherein the absorbing structures comprise a plurality of graphene flakes.

146. A method as recited in clause 136 wherein the absorbing structures comprise a combination of a plurality of block-shaped metallic elements and a plurality of graphene flakes.

147. A method as recited in clause 136 wherein the absorbing structures are arranged in a periodic array.

148. A method as recited in clause 147 wherein a pitch of the periodic array is selected to achieve maximum absorption of energy from the electron beam.

149. A method as recited in clause 136 wherein the transparent conductive material comprises indium-tin-oxide.

150. A method as recited in clause 136 wherein the transparent conductive material comprises doped zinc oxide.

151. A method as recited in clause 136 wherein the transparent conductive material comprises carbon nanotubes.

152. A method as recited in clause 136 wherein the transparent conductive material comprises an amorphous material.

153. A method as recited in clause 136 wherein the transparent conductive material comprises a doped transparent semiconductor.

154. A method as recited in clause 136 wherein the transparent conductive material comprises a conductive polymer.

155. A method as recited in clause 136 wherein the transparent conductive material comprises a body comprising a transparent material and coating of a conductive material.

156. A method as recited in clause 155 wherein the coating of a conductive material comprises gold.

157. A method as recited in clause 155 wherein the coating of a conductive material comprises aluminum.

158. A method as recited in clause 155 wherein the coating of a conductive material comprises titanium.

159. A method as recited in clause 155 wherein the coating of a conductive material comprises chromium.

160. A method as recited in clause 135 wherein the structure comprises a substantially cylindrical column.

161. A method as recited in clause 160 wherein the substantially cylindrical column comprises an electrically conductive material.

162. A method as recited in clause 160 wherein the electron beam propagates along a central axis of the column.

163. A method as recited in clause 160 wherein the radius of the substantially cylindrical column decreases in a direction the electron beam propagates.

164. A method as recited in clause 160 wherein a length of the part of the column traversed by the electron beam is chosen to cause a predetermined amount of deceleration of electrons in the electron beam.

165. A method as recited in clause 136 wherein dimensions of the absorbing structures vary in a direction in which the electron beam propagates.

166. An apparatus for narrowing an energy spread of a charged particles beam, the apparatus comprising:
structure defining a cavity extending along a part of a path of the charged particles beam, the cavity having an interior surface; and
a metamaterial absorber provided on the interior surface.

167. An apparatus as recited in clause 166 wherein the metamaterial absorber comprises a layer of a dielectric material on at least part of the interior surface wherein the layer of a transparent conductive material is provided with a plurality of absorbing structures.

168. An apparatus as recited in clause 166 wherein the metamaterial absorber comprises a layer of a transparent conductive material on at least part of the interior surface wherein the layer of a transparent conductive material is provided with a plurality of absorbing structures.

169. An apparatus as recited in clause 168 wherein the absorbing structures are metamaterial perfect absorbers.

170. An apparatus as recited in clause 168 wherein the absorbing structures are plasmonic structures.

171. An apparatus as recited in clause 168 wherein the absorbing structures resonantly absorb electromagnetic energy.

172. An apparatus as recited in clause 168 wherein the absorbing structures are at least partially embedded in or coupled to the layer of transparent conductive material.

173. An apparatus as recited in clause 168 wherein the absorbing structures are fabricated on top of the layer of transparent conductive material.

174. An apparatus as recited in clause 168 wherein the absorbing structures are printed on the layer of transparent conductive material.

175. An apparatus as recited in clause 168 wherein the absorbing structures comprise a plurality of block-shaped elements comprising a metallic material.

176. An apparatus as recited in clause 168 wherein the absorbing structures comprise graphene.

177. An apparatus as recited in clause 168 wherein the absorbing structures comprise a plurality of graphene flakes.

178. An apparatus as recited in clause 168 wherein the absorbing structures comprise a combination of a plurality of block-shaped metallic elements and a plurality of graphene flakes.

179. An apparatus as recited in clause 168 wherein the absorbing structures are arranged in a periodic array.

180. A method of reducing a width of an energy distribution in a beam of charged particles, the method comprising the step of passing the beam through a volume of space defined by a structure extending along a path of the beam, the structure having a surface provided with a metamaterial absorber arranged to absorb energy from the charged particles.

181. An apparatus comprising:
a first set of pixels configured to shape a first beamlet approaching the first set of pixels; and
a first set of pixel control members respectively associated with each of the first set of pixels, each pixel control member being arranged and configured to apply a signal to the associated pixel for shaping the first beamlet.

182. The apparatus of clause 181, wherein the first set of pixels has a voltage distribution configured to be adjusted based on a reflection of charged particles associated with the first beamlet above the first sets of pixels.

183. The apparatus of any of clauses 181 or 182, wherein the first beamlet is shaped to cause a reduction of an aberration.

184. The apparatus of any of clauses 181-183, wherein the first set of pixels and the first set of pixel control members are implemented in a component.

185. The apparatus of any of clauses 181-183, wherein the first set of pixels and the first set of pixel control members are implemented in separate components.

186. The apparatus of any of clauses 181-183, wherein each pixel of the first set of pixels and a corresponding pixel control member of the first set of pixel control members are implemented in a component.

187. The apparatus of any of clauses 181-183, wherein each pixel of the first set of pixels and a corresponding pixel control member of the first set of pixel control members are implemented in separate components.

188. The apparatus of any of clauses 181-187, wherein the signal triggers the associated pixel to generate an electric field for shaping the first beamlet.

189. The apparatus of any of clauses 181-187, wherein the first set of pixels is further configured to reflect the shaped first beamlet.

190. The apparatus of any of clauses 181-189, wherein the signal comprises a negative voltage to enable the associated pixel to reflect negatively charged particles of the first beamlet or to remove positively charged particles from the first beamlet.

191. The apparatus of any of clauses 181-190, wherein the first set of pixels comprises a subset of pixels tilted to remove charged particles from the first beamlet.

192. The apparatus of any of clauses 181-189, wherein the signal comprises a positive voltage to enable the associated pixel to reflect positively charged particles of the first beamlet or to remove negatively charged particles from the first beamlet.

193. The apparatus of any of clauses 181-192, wherein the signal comprises AC voltage to shape the profile of the first beamlet synchronously with the beam scanning over a sample.

194. The apparatus of any one of clauses 181-193, further comprising:
a second set of pixels configured to shape a second beamlet approaching the second set of pixels; and
a second set of pixel control members respectively associated with each of the second set of pixels, each pixel control member being arranged and configured to apply a signal to the associated pixel for shaping the second beamlet.

195. The apparatus of clause 194, wherein the first set of pixels and the second set of pixels are part of a mirror plate.

196. The apparatus of clause 194, wherein each of the first set of pixels and second set of pixels comprises a set of rectangular, hexagonal, or ring segment pixels.

197. The apparatus of any of clauses 194-196, wherein the first set of pixels and the second set of pixels are arranged in a square or hexagonal pattern.

198. The apparatus of clause 181, wherein the first set of pixels comprises different sizes and shapes of pixels.

199. The apparatus of clause 181, wherein the first set of pixels is disposed on a plate-shaped member, and the plate-shaped member is curved, the curvature of the plate-shaped member is adjusted by mechanical actuators.

200. The apparatus of clause 181, wherein the first set of pixel control members is configured to apply negative voltages, zero, or positive voltages to shape the first beamlet.

201. The apparatus of clause 181, wherein the first set of pixels has a voltage distribution configured to be adjusted based on a landing energy of charged particles associated with the first beamlet.

202. The apparatus of clause 181, wherein the first set of pixels has a voltage distribution configured to be adjusted based on a current of charged particles associated with the first beamlet.

203. The apparatus of clause 181, wherein the first set of pixels has a voltage distribution configured to be adjusted based on a landing angle at a sample.

204. The apparatus of clause 181, wherein the first set of pixels has a voltage distribution configured to be adjusted based on a magnitude of an electric field at a sample.

205. A system for manipulating a charged particle beamlet comprising:
a source of a beamlet of charged particles; and
a programmable charged-particle mirror plate arranged to receive the beamlet and configured to shape the beamlet.

206. The system of clause 205, further comprising:
a source of a beamlet of charged particles; and
a programmable charged-particle mirror plate arranged to receive the beamlet and configured to shape the beamlet.

207. The system of clause 205, further comprising:
a plurality of electrodes configured to influence the directed beamlet; and
a plurality of drivers respectively associated with each of the plurality of electrodes, each driver configured to provide adjustable voltages.

208. The system of clause 205, further comprising:
a plurality of electromagnetic optical elements, coupled with adjustable excitations, configured to influence the directed beamlet; and
a plurality of drivers respectively associated with each of the plurality of electromagnetic optical elements, each driver configured to adjust excitations of the corresponding electromagnetic optical element.

209. The system of clause 205, further comprising:
an optical element configured to direct the beamlet to the programmable charged-particle mirror plate,
wherein the programmable charged-particle mirror plate can further be configured to direct the shaped beamlet to the optical element.

210. The system of clause 209, wherein the optical element is configured to receive and direct multiple beamlets and the programmable charged-particle mirror plate is arranged to receive and reflect the multiple beamlets.

211. The system of clause 205, wherein the programmable charged-particle mirror plate has a plurality of controlled pixels in the mirror plate, each of the multiple beamlets corresponds to an associated set of controlled pixels configured to shape the corresponding beamlet.

212. A method for shaping a beamlet of charged particles, the method comprising:
directing, using an optical element, a first beamlet of charged particles towards a charged-particle mirror plate; and
shaping, using the charged-particle mirror plate, the first beamlet by providing signals to a first set of pixels of the charged-particle mirror plate to generate an electric field and by reflecting the shaped beamlet.

213. The method of clause 212, wherein the shaped beamlet is directed to the optical element.

214. The method of clause 212, further comprising:
directing, using the optical element, a second beamlet of charged particles towards the charged-particle mirror plate; and
shaping, using the charged-particle mirror plate, the second beamlet by providing signals to a second set of pixels of the charged-particle mirror plate to generate an electric field and by reflecting the shaped beamlet to the optical element.

215. A non-transitory computer-readable medium storing a set of instructions that are executable by a controller of an apparatus to cause the apparatus to perform a method to shape a beamlet of charged particles, the method comprising:
directing, using an optical element, a first beamlet of charged particles towards a charged-particle mirror plate; and
shaping, using the charged-particle mirror plate, the first beamlet by providing signals to a first set of pixels of the charged-particle mirror plate to generate an electric field and by reflecting the shaped beamlet to the optical element.

216. The non-transitory computer-readable medium of clause 215, wherein the set of instructions that are executable by the controller of the apparatus to cause the apparatus to further perform:
directing, using the optical element, a second beamlet of charged particles towards the charged-particle mirror plate; and
shaping the second beamlet by providing signals to a second set of pixels of the charged-particle mirror plate to generate an electric field and reflecting the shaped beamlet to the optical element by the charged-particle mirror plate.

217. An apparatus comprising:
an absorbing component configured to manipulate a beamlet approaching the absorbing component by absorbing electromagnetic energy to reduce an energy spread; and
a mirror plate configured to shape the beamlet, the mirror plate embedding or coupled to the absorbing component.

218. The apparatus of clause 217, wherein the absorbing component comprises:
a set of absorbing structures configured to absorb electromagnetic energy; and
a transparent conductor layer embedding or coupled to the set of absorbing structures, the transparent conductor layer disposed on top of the mirror plate.

219. The apparatus of clause 218, wherein the set of absorbing structures can be tuned by choosing a shape and dimensions and altering a pitch between the absorbing structures to reduce the energy spread of the beamlet.

220. The apparatus of clause 218, wherein the set of absorbing structures comprises a plurality of graphene flakes.

221. The apparatus of clause 218, wherein the set of absorbing structures comprises metallic elements.

222. The apparatus of clause 218, wherein the set of absorbing structures comprises a combination of metallic elements and a plurality of graphene flakes.

223. The apparatus of clause 218, wherein transparent conductor layer comprises a dielectric material.

224. The apparatus of clause 218, wherein transparent conductor layer comprises a transparent conductive material.

225. The apparatus of clause 219, wherein the transparent conductive material conducts stray electrons of the beamlet impinging on the transparent conductor layer away from the absorbing component and avoids charging of the absorbing component.

226. The apparatus of clause 217, wherein the mirror plate comprises:
a set of pixels configured to shape the beamlet approaching the set of pixels; and
a set of pixel control members respectively associated with each of the set of pixels, each pixel control member being arranged and configured to apply a signal to the associated pixel for shaping the beamlet.

227. The apparatus of clause 226, wherein the set of pixels has a voltage distribution configured to be adjusted based on a reflection of charged particles associated with the beamlet above the set of pixels.

228. The apparatus of clause 226, wherein the beamlet is shaped to cause a reduction of an aberration.

229. The apparatus of clause 226, wherein the signal triggers the associated pixel to generate an electric field for shaping the beamlet.

230. The apparatus of clause 226, wherein the set of pixels is further configured to reflect the shaped and manipulated beamlet.

231. The apparatus of clause 226, wherein each pixel of the set of pixels has a corresponding absorbing component.

232. A system for manipulating a charged particle beamlet comprising:
a source of a beamlet of charged particles; and
an absorbing component configured to manipulate the beamlet approaching the absorbing component by absorbing electromagnetic energy to reduce an energy spread.

233. The system of clause 232, further comprising:
a programmable charged-particle mirror plate arranged to receive the beamlet and configured to shape the beamlet, the mirror plate embedding or coupled to the absorbing component.

234. The system of any one of clauses 232 and 233, further comprising:
a first optical element configured to direct the beamlet to the absorbing component,
wherein the absorbing component can further be configured to direct the manipulated beamlet to the first optical element.

235. The system of clause 234, wherein the first optical element is configured to receive and direct multiple beamlets and the absorbing component is arranged to receive and reflect the multiple beamlets.

236. The system of clause 234, wherein the first optical element can further be configured to direct the manipulated beamlet from the absorbing component into another direction.

237. The system of any one of clauses 233-236, further comprising:
a second optical element configured to direct the beamlet to the programmable charged-particle mirror plate,
wherein the programmable charged-particle mirror plate can further be configured to direct the shaped beamlet to the second optical element.

238. The system of clause 237, wherein the second optical element is configured to receive and direct multiple beamlets and the programmable charged-particle mirror plate is arranged to receive and reflect the multiple beamlets.

239. The system of clause 237, wherein the second optical element can further be configured to direct the shaped beamlet from the programmable charged-particle mirror plate into another direction.

240. The system of clause 237, wherein the second optical element is positioned upstream from the first optical element.

241. The system of clause 237, wherein the first optical element is positioned upstream from the second optical element.

242. A method for manipulating a beamlet of charged particles, the method comprising:
directing, using an optical element, a beamlet of charged particles towards a structure comprising a charged-particle mirror plate and an absorbing component;
manipulating, using the absorbing component, the beamlet by using absorbing structures of the absorbing component to reduce an energy spread of the beamlet; and
shaping, using the charged-particle mirror plate, the beamlet by providing signals to a set of pixels of the charged-particle mirror plate to generate an electric field and by reflecting the shaped and manipulated beamlet.

243. The method of clause 242, wherein the shaped and manipulated beamlet is directed to the optical element.

244. A method for manipulating a beamlet of charged particles, the method comprising:
manipulating, using an absorbing component, the beamlet by using absorbing structures of the absorbing component to reduce an energy spread of the beamlet; and
shaping, using a charged-particle mirror plate, the beamlet by providing signals to a set of pixels of the charged-particle mirror plate to generate an electric filed and by reflecting the shaped beamlet.

245. The method of clause 244, further comprising directing, using a first optical element, a beamlet of charged particles towards the absorbing component.

246. The method of clause 245, wherein manipulating the beamlet comprises reflecting the manipulated beamlet to the first optical element.

247. The method of clause 246, further comprising directing, using the first optical element, the beamlet received from the absorbing component towards a downstream component.

248. The method of any one of clauses 245-246, further comprising directing, using a second optical element, the beamlet towards the charged-particle mirror plate.

249. The method of clause 248, wherein the second optical element is downstream from the first separator.

250. The method of clause 248, wherein the shaped beamlet is reflected to the second optical element.

251. The method of clause 248, further comprising directing, using the second optical element, the shaped beamlet towards another downstream component.

252. The method of clause 251, wherein another downstream component comprises the first optical element.

253. A non-transitory computer-readable medium storing a set of instructions that are executable by a controller of an apparatus to cause the apparatus to perform a method to manipulate a beamlet of charged particles, the method comprising:
  directing, using an optical element, a beamlet of charged particles towards a structure comprising a charged-particle mirror plate and an absorbing component;
  manipulating, using the absorbing component, the beamlet by using absorbing structures of the absorbing component to reduce an energy spread of the beamlet; and
  shaping, using the charged-particle mirror plate, the beamlet by providing signals to a set of pixels of the charged-particle mirror plate to generate an electric field and by reflecting the shaped and manipulated beamlet.

254. A non-transitory computer-readable medium storing a set of instructions that are executable by a controller of an apparatus to cause the apparatus to perform a method to manipulate a beamlet of charged particles, the method comprising:
  manipulating, using an absorbing component, the beamlet by using absorbing structures of the absorbing component to reduce an energy spread of the beamlet; and
  shaping, using a charged-particle mirror plate, the beamlet by providing signals to a set of pixels of the charged-particle mirror plate to generate an electric field and by reflecting the shaped beamlet.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The invention claimed is:

1. A charged particle beam apparatus, comprising:
  a charged particle beam source configured to emit a charged particle beam toward a sample;
  a charged particle detector configured to detect charged particles emitted from the sample; and
  an apparatus configured to narrow an energy spread of the charged particle beam, the apparatus comprising:
    a structure defining a cavity extending along a part of a path of the charged particle beam, the cavity having an interior surface; and
    a metamaterial absorber provided on the interior surface.

2. The charged particle beam apparatus of claim 1, wherein the metamaterial absorber comprises a layer of a dielectric material on at least part of the interior surface, wherein the layer of a dielectric material is provided with a plurality of absorbing structures.

3. The charged particle beam apparatus of claim 1, wherein the metamaterial absorber comprises a layer of a transparent conductive material on at least part of the interior surface wherein the layer of a transparent conductive material is provided with a plurality of absorbing structures.

4. The charged particle beam apparatus of claim 3, wherein the absorbing structures are metamaterial perfect absorbers.

5. The charged particle beam apparatus of claim 3, wherein the absorbing structures are plasmonic structures.

6. The charged particle beam apparatus of claim 3, wherein the absorbing structures resonantly absorb electromagnetic energy.

7. The charged particle beam apparatus of claim 3, wherein the absorbing structures are at least partially embedded in or coupled to the layer of transparent conductive material.

8. The charged particle beam apparatus of claim 3, wherein the absorbing structures are fabricated on top of the layer of transparent conductive material.

9. The charged particle beam apparatus of claim 3, wherein the absorbing structures are printed on the layer of transparent conductive material.

10. The charged particle beam apparatus of claim 3, wherein the absorbing structures comprise a plurality of block-shaped elements comprising a metallic material.

11. The charged particle beam apparatus of claim 3, wherein the absorbing structures comprise graphene.

12. The charged particle beam apparatus of claim 3, wherein the absorbing structures comprise a plurality of graphene flakes.

13. The charged particle beam apparatus of claim 3, wherein the absorbing structures comprise a combination of a plurality of block-shaped metallic elements and a plurality of graphene flakes.

14. The charged particle beam apparatus of claim 3, wherein the absorbing structures are arranged in a periodic array.

15. A charged particle beam method, comprising:
  irradiating a charged particle beam through a volume of space to a substrate;
  reducing a width of an energy distribution of the charged particle beam by passing the charged particle beam through the volume of space, the volume of space being defined by a structure extending along a path of the charged particle beam, the structure having a surface provided with a metamaterial absorber arranged to absorb energy from the charged particles; and
  detecting emitted charged particles from the substrate by a charged particle detector.

* * * * *